(12) United States Patent
Nakatsuji et al.

(10) Patent No.: US 10,714,486 B2
(45) Date of Patent: Jul. 14, 2020

(54) STATIC RANDOM ACCESS MEMORY CELL EMPLOYING N-DOPED PFET GATE ELECTRODES AND METHODS OF MANUFACTURING THE SAME

(71) Applicant: SANDISK TECHNOLOGIES LLC, Addison, TX (US)

(72) Inventors: Hiroshi Nakatsuji, Yokkaichi (JP); Yasuyuki Aoki, Yokkaichi (JP); Shigeki Shimomura, Yokkaichi (JP); Akira Inoue, Yokkaichi (JP); Kazutaka Yoshizawa, Yokkaichi (JP); Hiroyuki Ogawa, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 43 days.

(21) Appl. No.: 16/130,104

(22) Filed: Sep. 13, 2018

(65) Prior Publication Data
US 2020/0091157 A1    Mar. 19, 2020

(51) Int. Cl.
*H01L 29/78* (2006.01)
*H01L 21/336* (2006.01)
*H01L 21/265* (2006.01)
*H01L 21/768* (2006.01)
*H01L 27/11* (2006.01)
*H01L 21/8234* (2006.01)

(52) U.S. Cl.
CPC .... *H01L 27/1104* (2013.01); *H01L 21/76802* (2013.01); *H01L 21/823462* (2013.01)

(58) Field of Classification Search
CPC .......... H01L 27/1104; H01L 21/76802; H01L 21/823462

USPC .......................................... 365/154, 155, 156
See application file for complete search history.

(56) References Cited

U.S. PATENT DOCUMENTS

| | | | |
|---|---|---|---|
| 4,391,650 A * | 7/1983 | Pfeifer | ............ H01L 21/823814 148/DIG. 70 |
| 5,497,021 A | 3/1996 | Tada | |
| 5,923,056 A | 7/1999 | Lee et al. | |
| 5,960,319 A * | 9/1999 | Iwata | ................ H01L 21/26506 438/664 |
| 6,060,755 A | 5/2000 | Ma et al. | |
| 6,165,918 A | 12/2000 | Jia et al. | |
| 6,184,087 B1 | 2/2001 | Wu | |
| 6,207,589 B1 | 3/2001 | Ma et al. | |
| 6,258,673 B1 | 7/2001 | Houlihan et al. | |
| 6,495,474 B1 | 12/2002 | Rafferty et al. | |

(Continued)

OTHER PUBLICATIONS

U.S. Appl. No. 15/916,720, filed Mar. 9, 2018, SanDisk Technologies LLC.

*Primary Examiner* — Ly D Pham
(74) *Attorney, Agent, or Firm* — The Marbury Law Group PLLC

(57) ABSTRACT

Field effect transistors for an SRAM cell can be formed employing n-doped gate electrode portions for p-type pull-up transistors. The SRAM cell includes a first series connection of a first p-type pull-up transistor and a first n-type pull-down transistor located between a power supply source and electrical ground, and a second series connection of a second p-type pull-up transistor and a second n-type pull-down transistor located between the power supply source and the electrical ground. Each gate electrode of the SRAM cell can include a respective n-doped gate electrode portion.

17 Claims, 31 Drawing Sheets

(56) References Cited

U.S. PATENT DOCUMENTS

| | | |
|---|---|---|
| 6,623,656 B2 | 9/2003 | Baum et al. |
| 6,661,061 B1 | 12/2003 | Gardner et al. |
| 6,720,627 B1* | 4/2004 | Iwata ................ H01L 21/26506 257/369 |
| 6,759,302 B1 | 7/2004 | Chen et al. |
| 6,791,125 B2 | 9/2004 | Demkov et al. |
| 6,818,493 B2 | 11/2004 | Hobbs et al. |
| 6,861,317 B1 | 3/2005 | Verma et al. |
| 6,908,822 B2 | 6/2005 | Rendon et al. |
| 7,008,833 B2 | 3/2006 | Li et al. |
| 7,098,496 B2 | 8/2006 | Li et al. |
| 7,118,974 B2 | 10/2006 | Chen et al. |
| 7,138,317 B2 | 11/2006 | Chen et al. |
| 7,160,771 B2 | 1/2007 | Chou et al. |
| 7,382,027 B2 | 6/2008 | Verma et al. |
| 7,508,648 B2 | 3/2009 | Ahn et al. |
| 7,755,128 B2 | 7/2010 | Clark |
| 7,812,400 B2* | 10/2010 | Liaw ................ H01L 21/823871 257/369 |
| 7,989,285 B2 | 8/2011 | Ahn et al. |
| 8,093,128 B2 | 1/2012 | Koutny, Jr. et al. |
| 8,102,006 B2 | 1/2012 | Zhou |
| 8,106,434 B2 | 1/2012 | Furukawa et al. |
| 8,114,728 B2* | 2/2012 | Pas .................... H01L 21/28079 257/E21.637 |
| 8,143,129 B2 | 3/2012 | Ramkumar et al. |
| 8,304,333 B2 | 11/2012 | Ramin et al. |
| 8,383,445 B2 | 2/2013 | Lee et al. |
| 8,481,395 B2 | 7/2013 | Ahn et al. |
| 8,679,927 B2 | 3/2014 | Ramkumar et al. |
| 8,742,515 B2 | 6/2014 | Ahn et al. |
| 9,087,722 B2 | 7/2015 | Adams et al. |
| 9,576,801 B2 | 2/2017 | Li et al. |
| 10,256,099 B1* | 4/2019 | Akaiwa ................ H01L 21/2652 |
| 2003/0022432 A1 | 1/2003 | Hobbs et al. |
| 2003/0142533 A1* | 7/2003 | Ueda ....................... G11C 11/22 365/145 |
| 2003/0205767 A1 | 11/2003 | Ma et al. |
| 2004/0061188 A1 | 4/2004 | Demkov et al. |
| 2004/0198000 A1 | 10/2004 | Chen et al. |
| 2004/0198001 A1 | 10/2004 | Chen et al. |
| 2005/0056899 A1 | 3/2005 | Rendon et al. |
| 2005/0059216 A1 | 3/2005 | Verma et al. |
| 2005/0077582 A1* | 4/2005 | Kawamata .......... G11C 11/4087 257/401 |
| 2005/0136573 A1 | 6/2005 | Rajverma et al. |
| 2005/0151210 A1 | 7/2005 | Li et al. |
| 2005/0253181 A1* | 11/2005 | Kimizuka ....... H01L 21/823857 257/310 |
| 2005/0269613 A1 | 12/2005 | Li et al. |
| 2006/0176645 A1 | 8/2006 | Ahn et al. |
| 2008/0230854 A1 | 9/2008 | Clark |
| 2008/0293207 A1 | 11/2008 | Koutny, Jr. et al. |
| 2008/0296661 A1 | 12/2008 | Ramkumar et al. |
| 2008/0296664 A1 | 12/2008 | Ramkumar et al. |
| 2009/0155976 A1 | 6/2009 | Ahn et al. |
| 2010/0001324 A1 | 1/2010 | Furukawa et al. |
| 2011/0006375 A1 | 1/2011 | Ramin et al. |
| 2011/0287601 A1 | 11/2011 | Ahn et al. |
| 2013/0235652 A1* | 9/2013 | Liaw .................... H01L 27/0207 365/156 |
| 2013/0292782 A1 | 11/2013 | Ahn et al. |
| 2016/0155748 A1 | 6/2016 | Li et al. |

\* cited by examiner

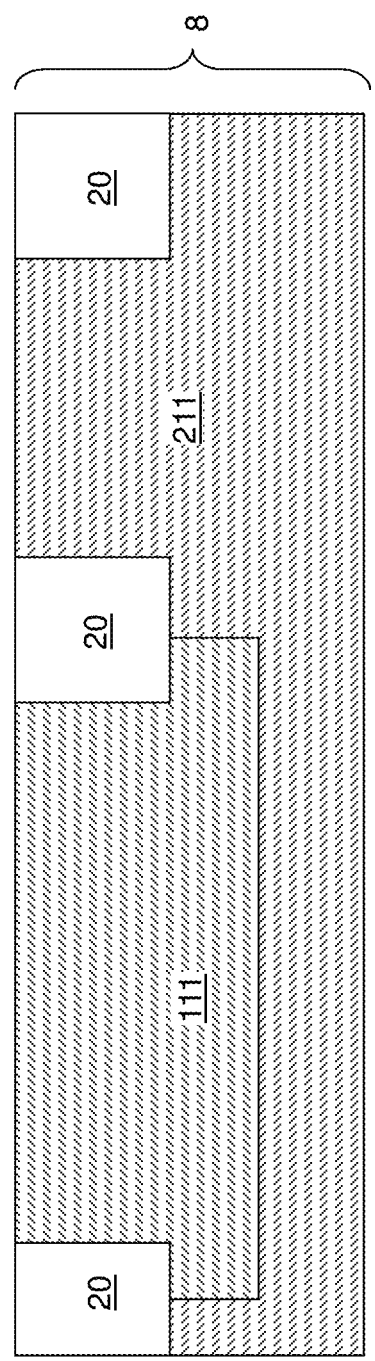

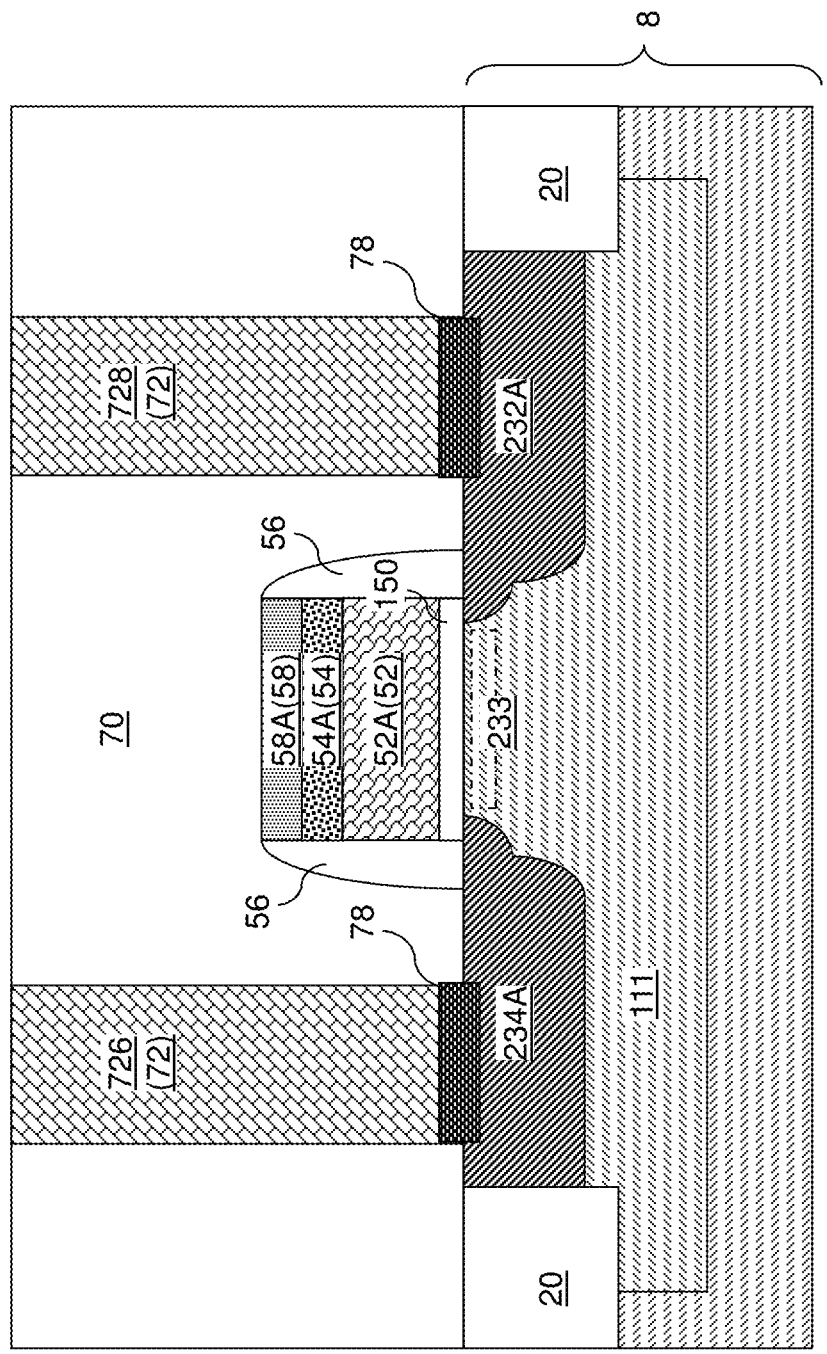

STATIC RANDOM ACCESS MEMORY CELL EMPLOYING N-DOPED PFET GATE ELECTRODES AND METHODS OF MANUFACTURING THE SAME

FIELD

The present disclosure relates to semiconductor structures, and particularly to static random access memory (SRAM) cells employing n-doped PFET gate electrodes and methods of manufacturing the same.

BACKGROUND

Static random access memory (SRAM) devices are employed extensively in many semiconductor devices for their non-volatile characteristics. An SRAM includes six transistors. As illustrated in FIG. 1, two pairs of series connections of a pull-up PFET (M2 or M4) and a pull-down NFET (M1 or M3) are provided between a power supply voltage VDD and electrical ground. The gate electrodes of each series connection are electrically shorted to each other, and are electrically shorted to a node between the pull-up PFET (M2 or M4) and the pull-down NFET (M1 or M3) to provide cross-coupling between two complementary nodes (Q and Q_bar) of the two pairs of series connections. Two pass gate transistors (M5 and M6) are controlled by gate electrodes connected to a common word line WL, and are connected two complementary bit lines (BL and BL_bar) that provide opposite signals. The states of the two complementary nodes (Q and Q_bar) are self-stabilizing and self-perpetuating, thereby enabling preservation of preservation of the states of the two complementary nodes (Q and Q_bar) when external power is turned off.

In conventional SRAMs known in the art, pull-up PFETs employ a p-doped semiconductor material for gate electrodes, and pull-down NFETs and pass gate transistors employ an n-doped semiconductor material to provide optimal gate work functions. The p-doped semiconductor material of the gate electrodes of the pull-up PFETs and the n-doped semiconductor material of the gate electrodes of the pull-down NFETs cannot be connected directly due to formation of p-n junctions therebetween. To avoid formation of p-n junctions, a pair of contact via structures and at least one metal interconnect line structure are employed to provide the electrical connection between the gate electrodes of the pull-up PFETs and the pull-down NFETS.

BRIEF SUMMARY

According to an aspect of the present disclosure, a static random access memory (SRAM) cell is provided, which comprises: a first series connection of a first p-type pull-up transistor and a first n-type pull-down transistor located between a power supply source and electrical ground; and a second series connection of a second p-type pull-up transistor and a second n-type pull-down transistor located between the power supply source and the electrical ground. Each of the first p-type pull-up transistor, the first n-type pull-down transistor, the second p-type pull-up transistor, and the second n-type pull-down transistor comprises a respective n-doped gate electrode portion. In one embodiment, the first p-type pull-up transistor comprises a first-thickness gate dielectric having a first thickness and the first n-type pull-down transistor comprises a second-thickness gate dielectric having a second thickness that is less than the first thickness.

According to another aspect of the present disclosure, a method of forming a static random access memory (SRAM) comprises forming a first series connection of a first p-type pull-up transistor and a first n-type pull-down transistor located between a power supply source and electrical ground over a semiconductor substrate, and forming a second series connection of a second p-type pull-up transistor and a second n-type pull-down transistor located between the power supply source and the electrical ground over the semiconductor substrate, wherein the first p-type pull-up transistor and the second p-type pull-up transistor comprise n-doped gate electrode portions, the first and second p-type pull-up transistors are formed on first-thickness gate dielectrics having a first thickness, and the first and second n-type pull-down transistors are formed on second-thickness gate dielectrics having a second thickness that is less than the first thickness.

BRIEF DESCRIPTION OF THE SEVERAL VIEWS OF THE DRAWINGS

FIG. 2B is a vertical cross-sectional view of the first exemplary structure of FIG. 2A along the vertical plane B-B'.

FIG. 7C is a vertical cross-sectional view of the first exemplary structure of FIG. 7A along the vertical plane C-C'.

DETAILED DESCRIPTION

Figure 1:
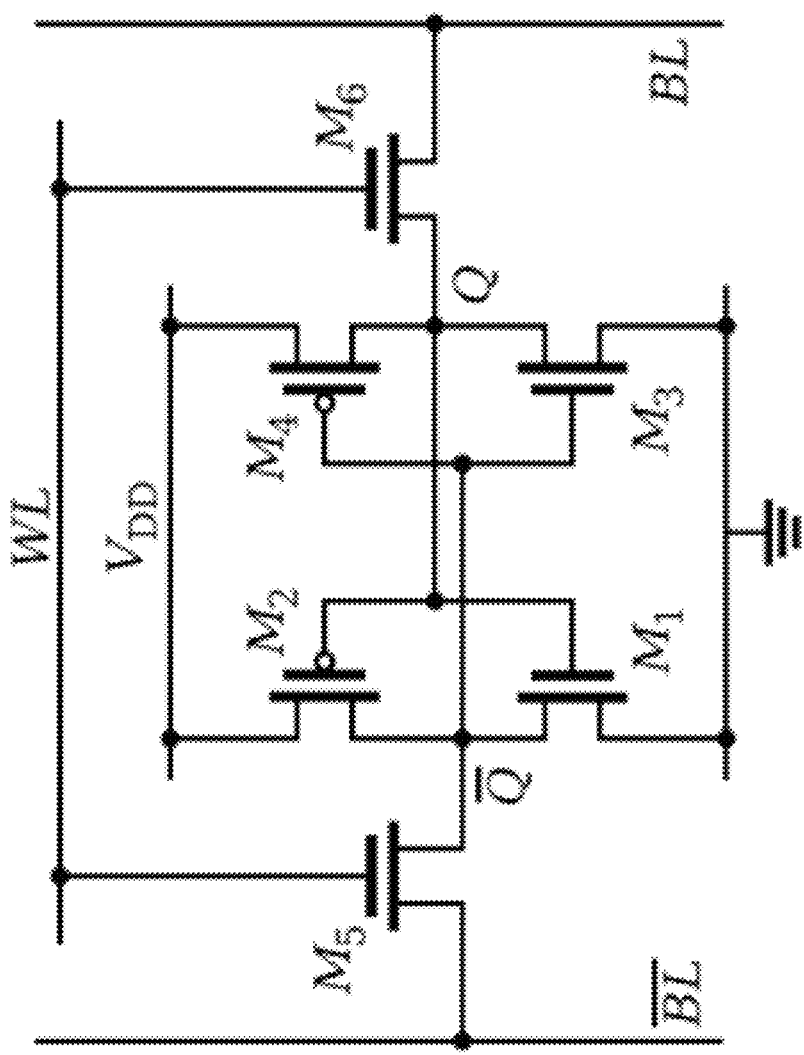
FIG. 1 is a circuit diagram of an SRAM device.

As stated above, the present disclosure is directed to static random access memory (SRAM) cells employing a n-doped gate electrode for a p-type field effect transistor (PFET) and methods of manufacturing the same, the various aspects of which are described herebelow in detail with accompanying figures.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Figure 2A:
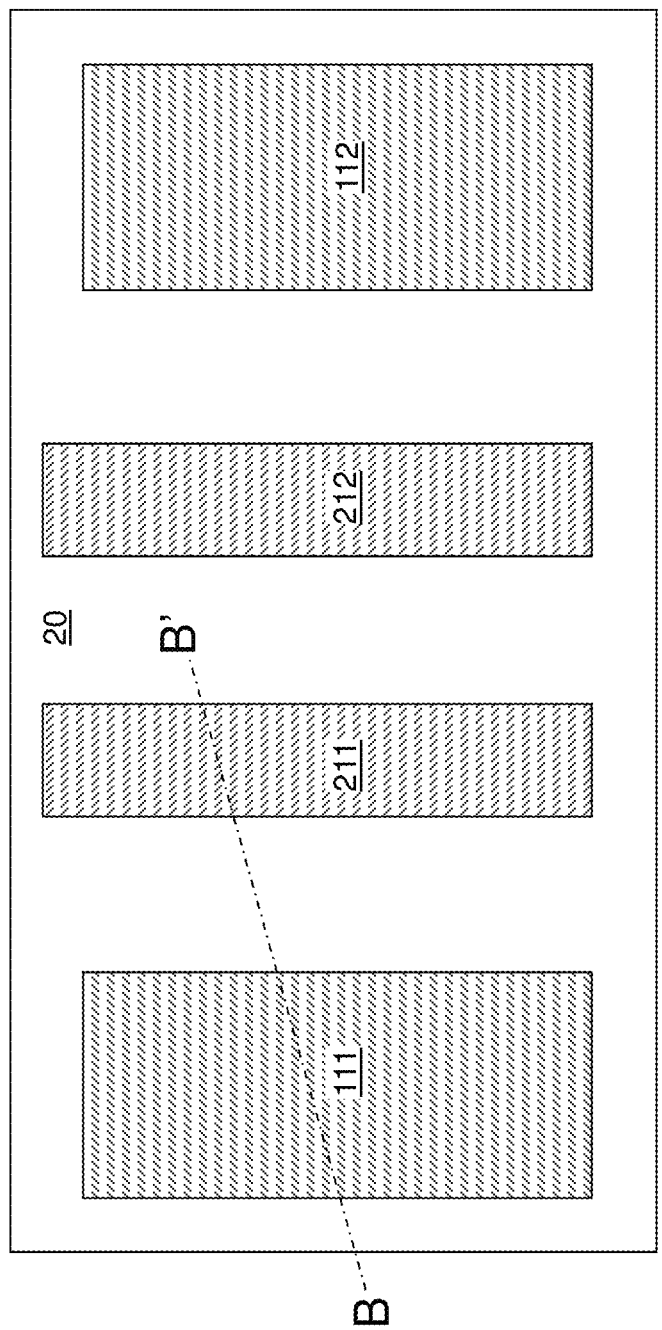
FIG. 2A is a top-down view of a first exemplary structure for forming an SRAM after formation of shallow trench isolation structure and active areas according to an embodiment of the present disclosure.

Referring to FIGS. 2A and 2B, a first exemplary structure according to an embodiment of the present disclosure, which is an in-process structure that is employed to form a static random access memory (SRAM) cell. As used herein, an in-process structure refers to a structure including a component that is subsequently modified in shape or composition. The first exemplary structure includes a substrate 8, which can be a semiconductor substrate embedding at least one dielectric structure such as a shallow trench isolation structure 20. The substrate can be a semiconductor wafer or a semiconductor material layer located on an insulating, semiconducting or conductive substrate, and can include at least one elemental semiconductor material (e.g., single crystal silicon wafer or layer), at least one compound semiconductor material, at least one II-VI compound semiconductor material, at least one organic semiconductor material, or other semiconductor materials known in the art. At least one n-type well (111, 112) and at least one p-type well (211, 212) are provided in an upper portion of the substrate 8 per SRAM cell to be formed. Depending on the layout of the SRAM cell, a pair of n-type wells (111, 112) and a pair of p-type wells (211, 212) can be provided per SRAM cell to be formed. Alternatively, the pair of n-type wells (111, 112) may be merged into a single n-type well 111, and/or the pair of p-type wells (211, 212) may be merged into a single p-type well 211. In one embodiment, the p-type wells (211, 212) or the n-type wells (111, 112) may have the same dopant concentration as the semiconductor material of the substrate 8. In this case, the p-type wells (211, 212) may be an extension of the semiconductor material of the substrate toward the top surface of the substrate 8. The n-type wells (111, 112) and/or the p-type wells (211, 212) can be formed by ion implantation of electrical dopants of a suitable conductivity type. Typically, the n-type wells (111, 112) and the p-type wells (211, 212) can be include electrical dopants (p-type dopants or n-type dopants) at an atomic concentration in a range from $1.0 \times 10^{15}/cm^3$ to $1.0 \times 10^{17}/cm^3$, although lesser and greater dopant concentrations can also be employed.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A shallow trench isolation structure 20 can be formed in an upper region of the substrate 8, for example, by forming connected shallow trenches that laterally surround discrete portions of the n-type wells (111, 112) and the p-type wells (211, 212), and by filling the connected shallow trenches with a dielectric material such as silicon oxide. Excess portions of the dielectric material can be removed from above the top plane including the top surface of the substrate 8. Optionally, sacrificial pad layers (such as a stack of a silicon oxide layer and a silicon nitride layer) may be employed as a planarization stopping layer during formation of the shallow trench isolation structure 20.

Physically exposed areas of the n-type wells (111, 112) and the p-type wells (211, 212) on the top surface of the substrate 8 are herein referred to as active areas. In one embodiment, the shallow trench isolation structure 20 laterally surrounds a first active area (which is the area of a first n-doped well 111) in which a first p-type pull-up transistor is to be subsequently formed, laterally surrounds a second active area (which is the area of a first p-doped well 211) in which a first n-type pull-down transistor and a first pass gate transistor are to be subsequently formed, laterally surrounds a third active area (which is the area of a second n-doped well 112) in which a second p-type pull-up transistor is to be subsequently formed, and laterally surrounds a fourth active area (which is the area of a second p-doped well 212) in which a second n-type pull-down transistor and a second pass gate transistor are to be subsequently formed. The top surface of the shallow trench isolation structure 20 may be coplanar with, located above, or located below the horizontal plane including the top surfaces of the n-type wells (111, 112) and the p-type wells (211, 212).

While the present disclosure is described employing an exemplary layout, it is understood that the layout of the various n-doped wells (111, 112) and p-doped wells (211, 212), gate electrodes to be subsequently formed, the various contact via structures to be subsequently formed, and the various metal lines to be subsequently formed can be altered in various manners consistent with the inventive spirit of the disclosed embodiments herein. Further, while a six-transistor SRAM cell is described herein, the methods and structures of the present disclosure is applicable to a five-transistor SRAM cell and a four-transistor SRAM cell to the extent compatible with the described embodiments herein.

Figure 3A:
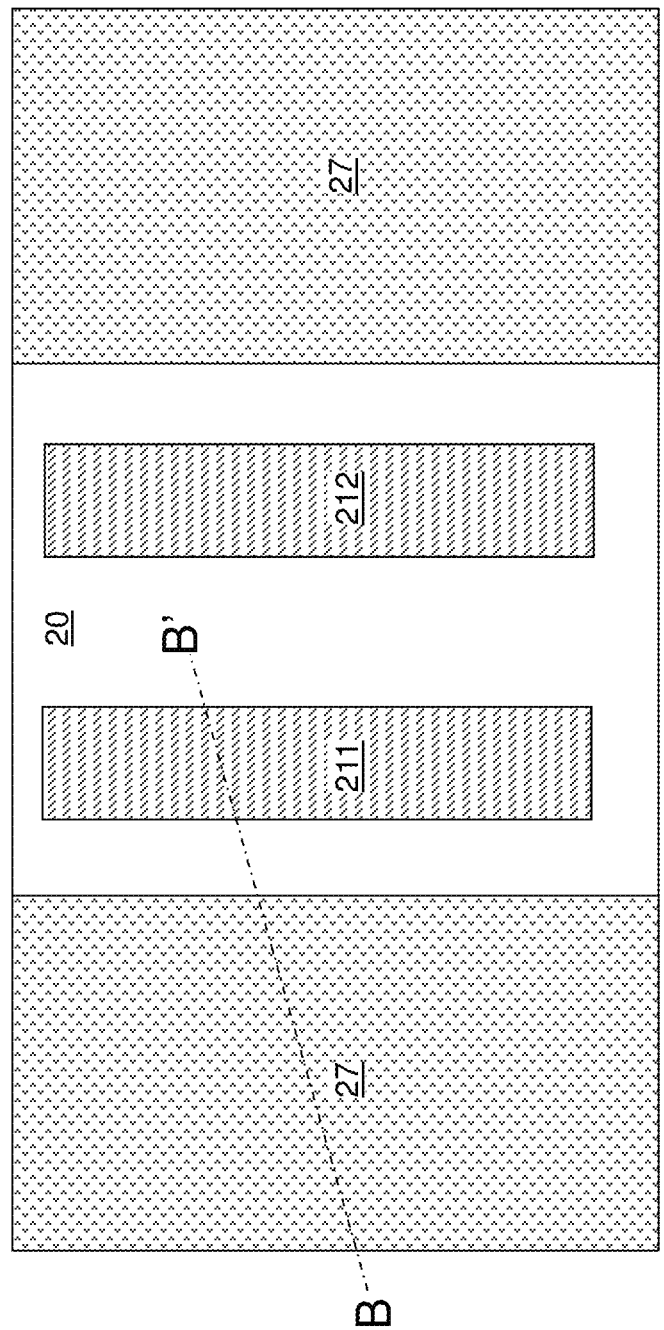
FIG. 3A is a top-down view of the first exemplary structure after patterning a first-thickness gate dielectric layer according to an embodiment of the present disclosure.
Figure 3B:
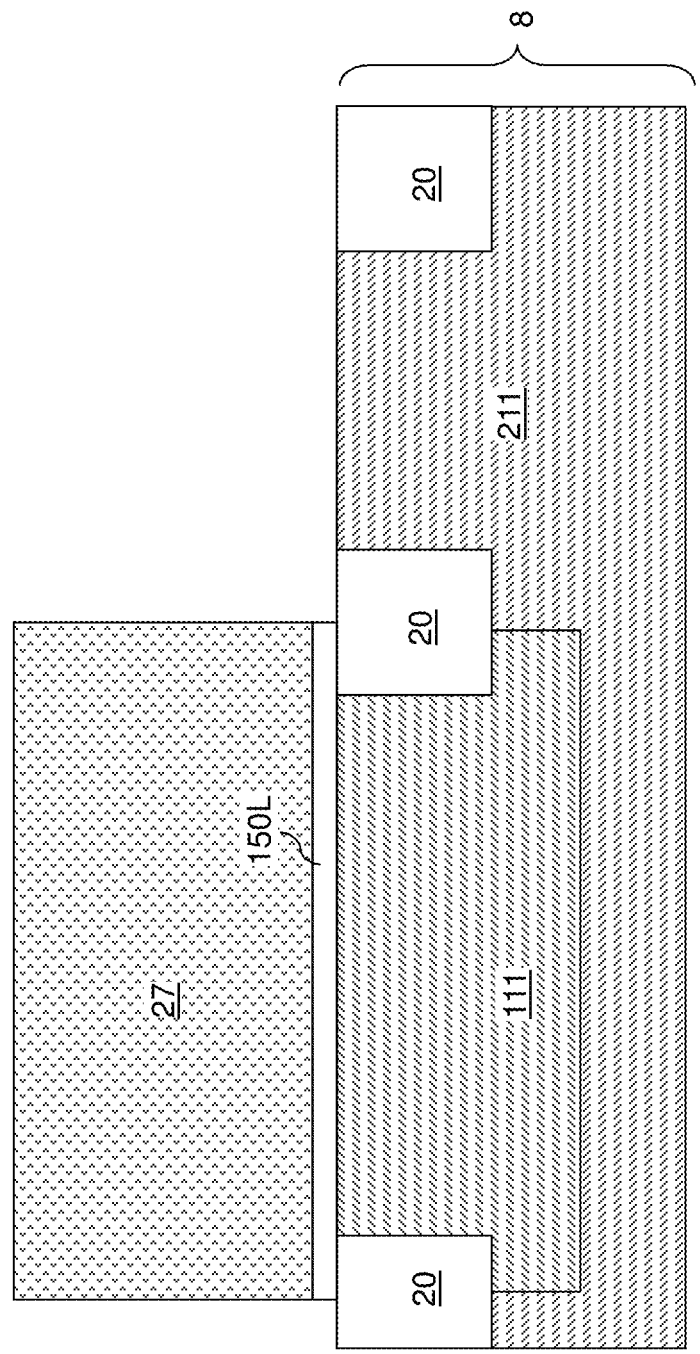
FIG. 3B is a vertical cross-sectional view of the first exemplary structure of FIG. 3A along the vertical plane B-B'.

Referring to FIGS. 3A and 3B, a first-thickness gate dielectric layer 150L can be formed on the top surfaces of the n-doped wells (111, 112) and p-doped wells (211, 212). In one embodiment, the first-thickness gate dielectric layer 150L may be formed by thermal conversion or plasma conversion of physically exposed surface portions of the n-doped wells (111, 112) and p-doped wells (211, 212) into a dielectric material layer. For example, thermal oxidation, thermal nitridation, plasma oxidation, and/or plasma nitridation can be employed to covert the physically exposed surface portions of the n-doped wells (111, 112) and p-doped wells (211, 212) into a dielectric material layer. Alternatively or additionally, the first-thickness gate dielectric layer 150L can be formed by deposition of at least one dielectric material such as silicon oxide and/or a dielectric metal oxide (such as aluminum oxide, hafnium oxide, and/or lanthanum oxide). The gate dielectric layer 150L shown in FIGS. 3A and 3B can be formed by deposition such that the gate dielectric layer 150L covers the isolation structures 20. If the gate dielectric layer 150L is formed by oxidation of the doped wells, then the isolation structures would be located between portions of the gate dielectric layer 150L. The thickness of the first-thickness gate dielectric layer 150L can be in a range from 1.5 nm to 10 nm, such as from 2 nm to 6 nm, although lesser and greater thickness can also be employed. In one embodiment, the first-thickness gate dielectric layer 150L can be formed as a continuous dielectric material layer that covers the entire top surface of the substrate 8. In another embodiment, the first-thickness gate dielectric layer 150L can be formed as discrete dielectric material portions that are formed only within the active areas, i.e., only on the top surfaces of the n-doped wells (111, 112) and p-doped wells (211, 212), for example, by thermal oxidation of the underlying semiconductor material.

The thickness of the first-thickness gate dielectric layer 150L can be selected such that gate dielectrics to be subsequently derived from the first-thickness gate dielectric layer 150L and to be employed for p-type field effect transistors provide a greater effective gate oxide thickness than gate dielectric to be subsequently employed for n-type field effect transistors. The difference in the thickness of the gate dielectrics for p-type field effect transistors and the gate dielectrics for n-type field effect transistors helps improve the write margin of the SRAM cell when combined with the n-doped semiconductor material to be subsequently employed for the gate electrodes of the p-type field effect transistors.

A photoresist layer 27 can be applied over the first-thickness gate dielectric layer 150L, and can be lithographically patterned to cover the areas for p-type field effect transistors to be subsequently formed. For example, the photoresist layer 27 can cover the areas of n-doped wells (111, 112), and not cover the areas of the p-doped wells (211, 212). Unmasked portions of the first-thickness gate dielectric layer 150L can be etched, for example, by an isotropic etch process such as a wet etch process. The first-thickness gate dielectric layer 150L can be patterned to cover the areas of the n-doped wells (111, 112), and not to cover the areas of the p-doped wells (211, 212). Thus, the top surfaces of the p-doped wells (211, 212) can be physically exposed after patterning the first-thickness gate dielectric layer 150L. The photoresist layer 27 can be subsequently removed, for example, by ashing.

Figure 4A:
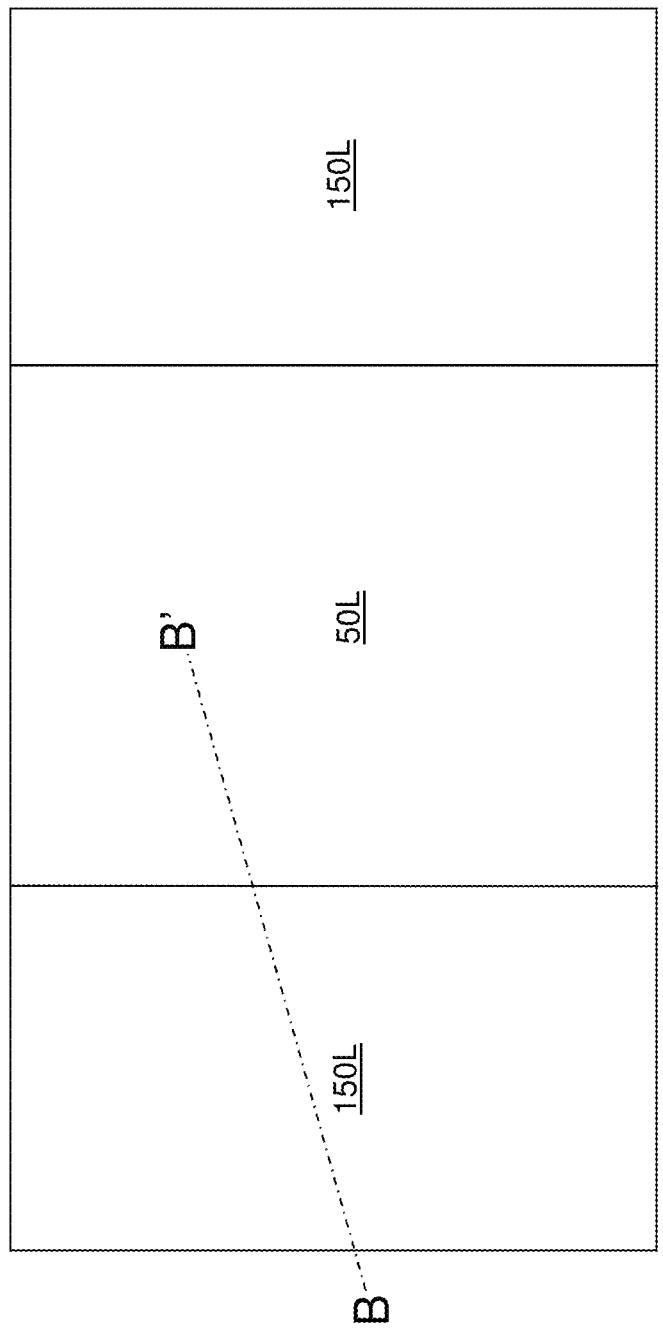
FIG. 4A is a top-down view of the first exemplary structure after forming a second-thickness gate dielectric layer according to an embodiment of the present disclosure.
Figure 4B:
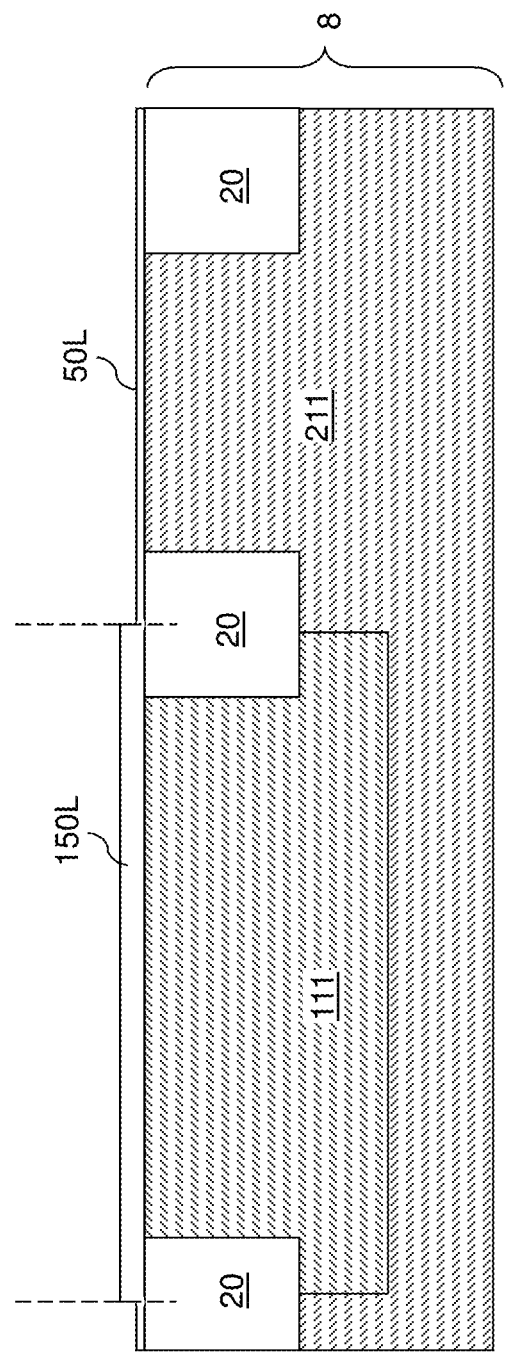
FIG. 4B is a vertical cross-sectional view of the first exemplary structure of FIG. 4A along the vertical plane B-B'.
Figure 5A:
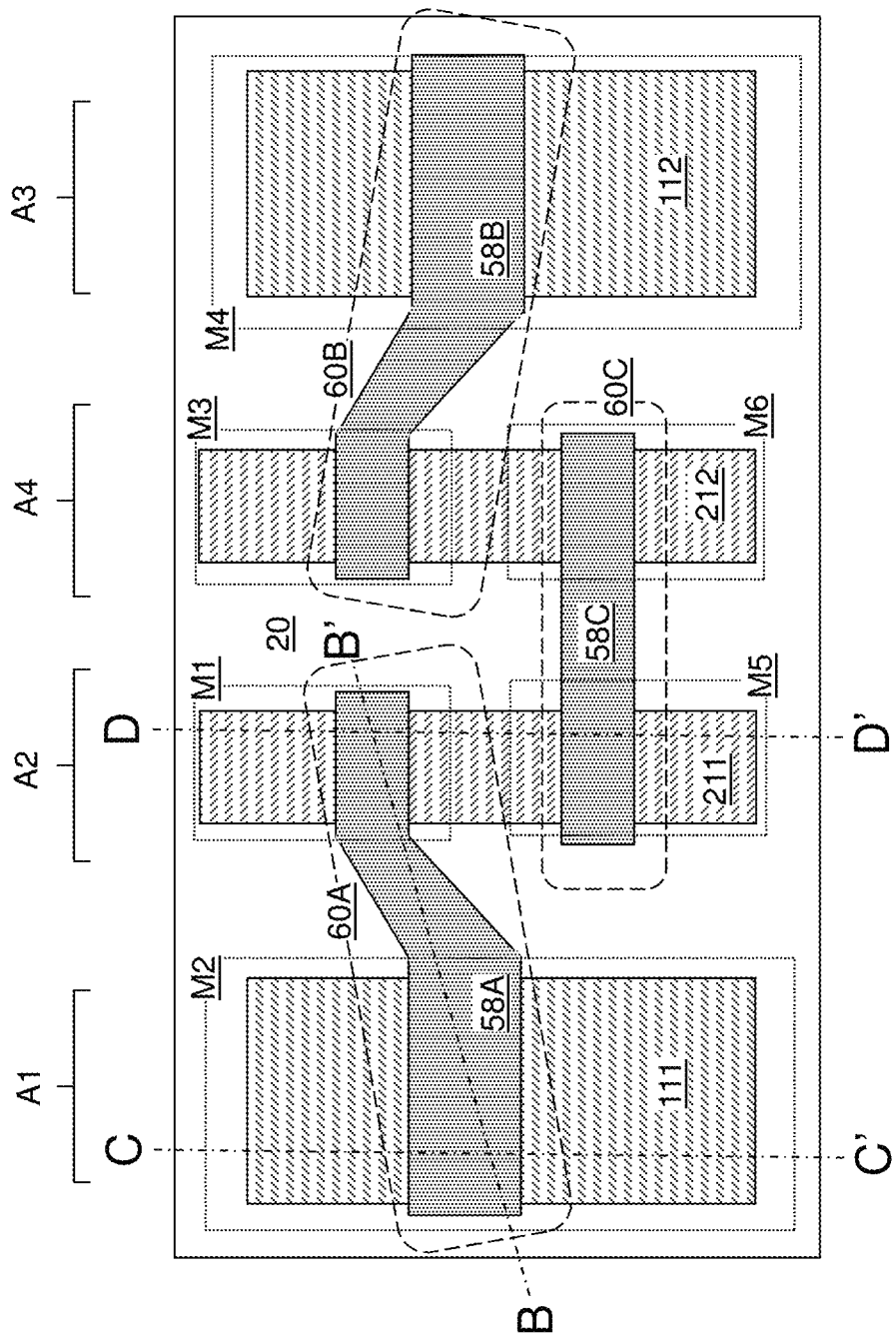
FIG. 5A is a top-down view of the first exemplary structure after forming gate stack structures including n-doped gate electrodes according to an embodiment of the present disclosure.
Figure 5B:
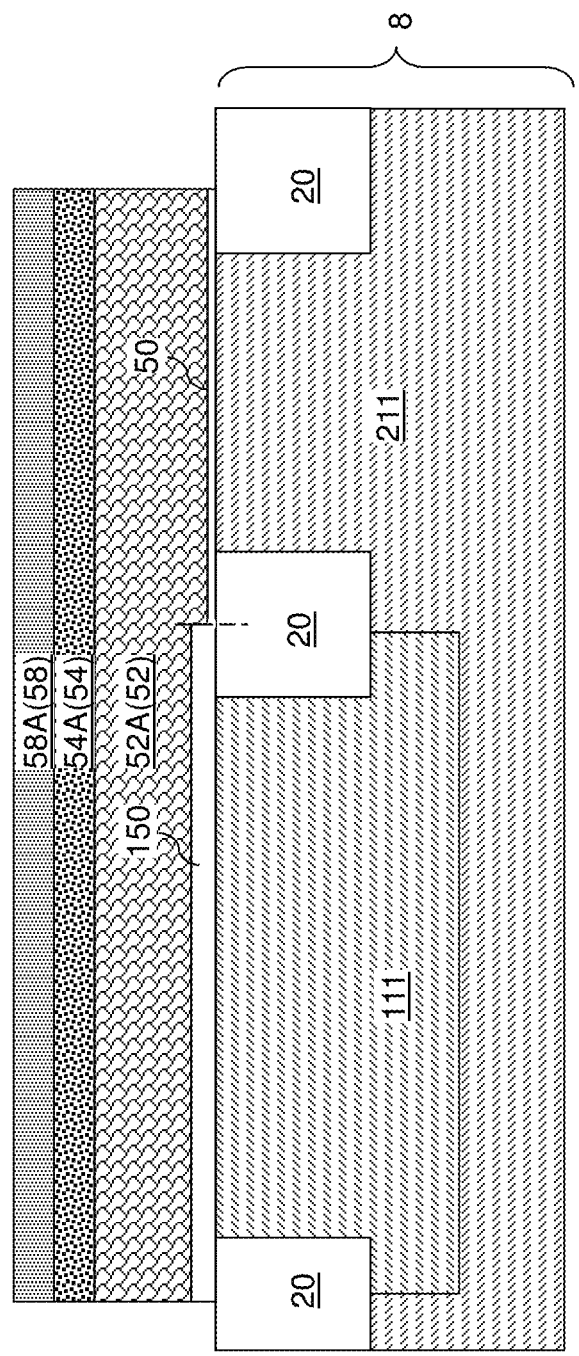
FIG. 5B is a vertical cross-sectional view of the first exemplary structure of FIG. 5A along the vertical plane B-B'.
Figure 5C:
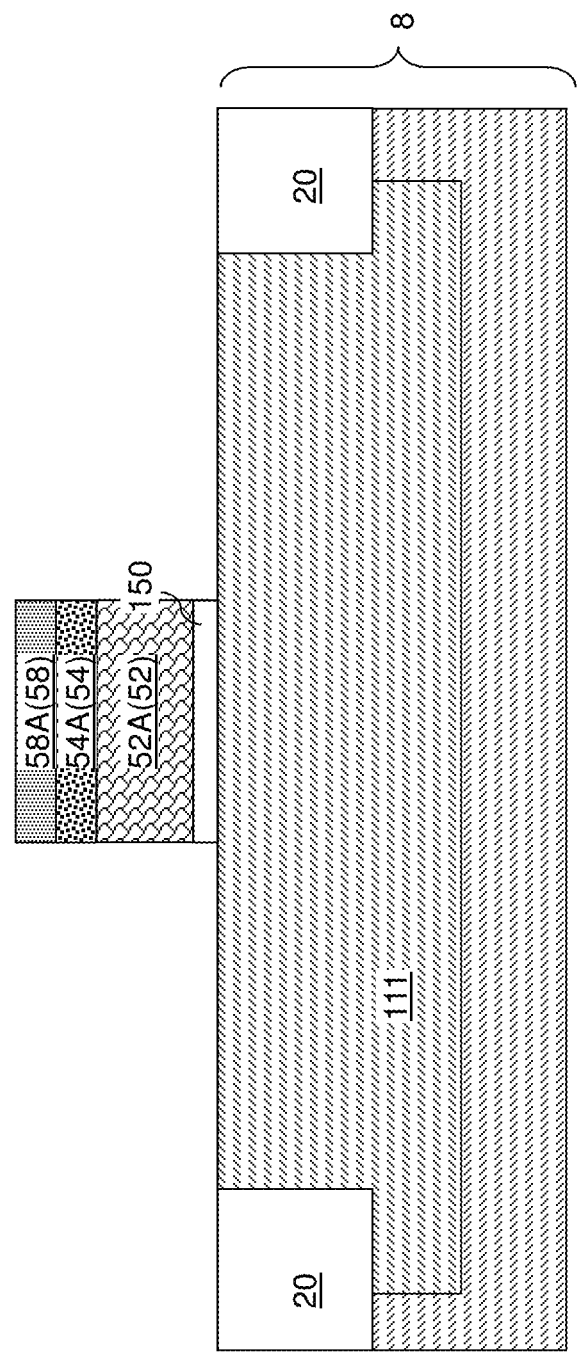
FIG. 5C is a vertical cross-sectional view of the first exemplary structure of FIG. 5A along the vertical plane C-C'.
Figure 5D:
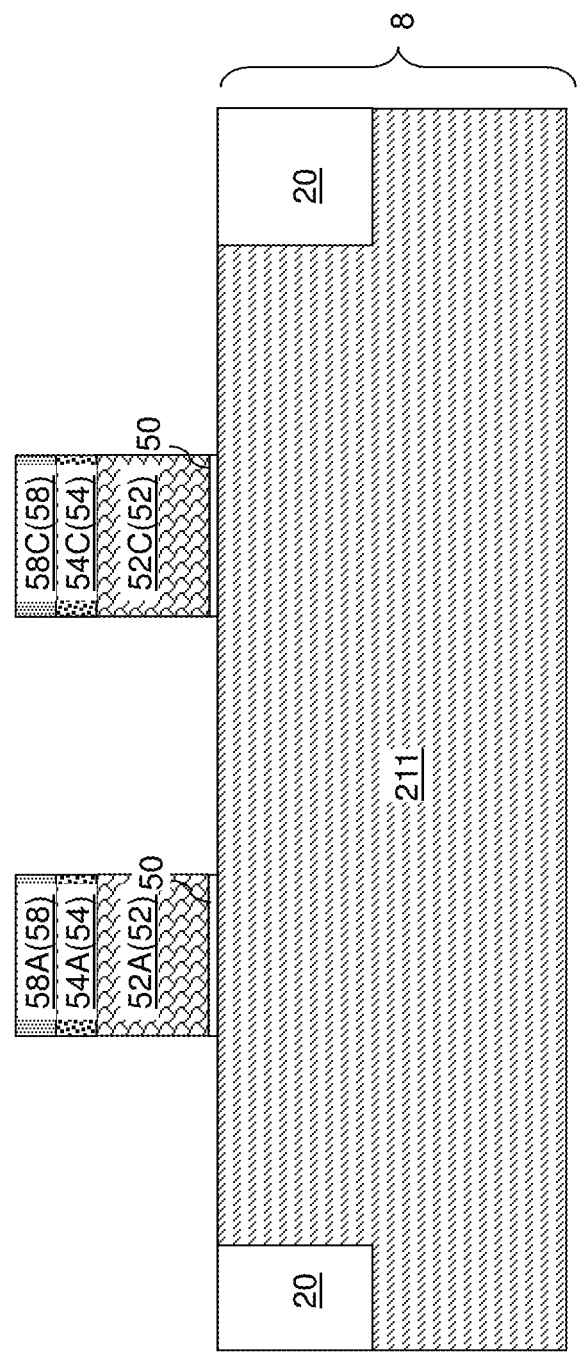
FIG. 5D is a vertical cross-sectional view of the first exemplary structure of FIG. 5A along the vertical plane D-D'.
Figure 6A:
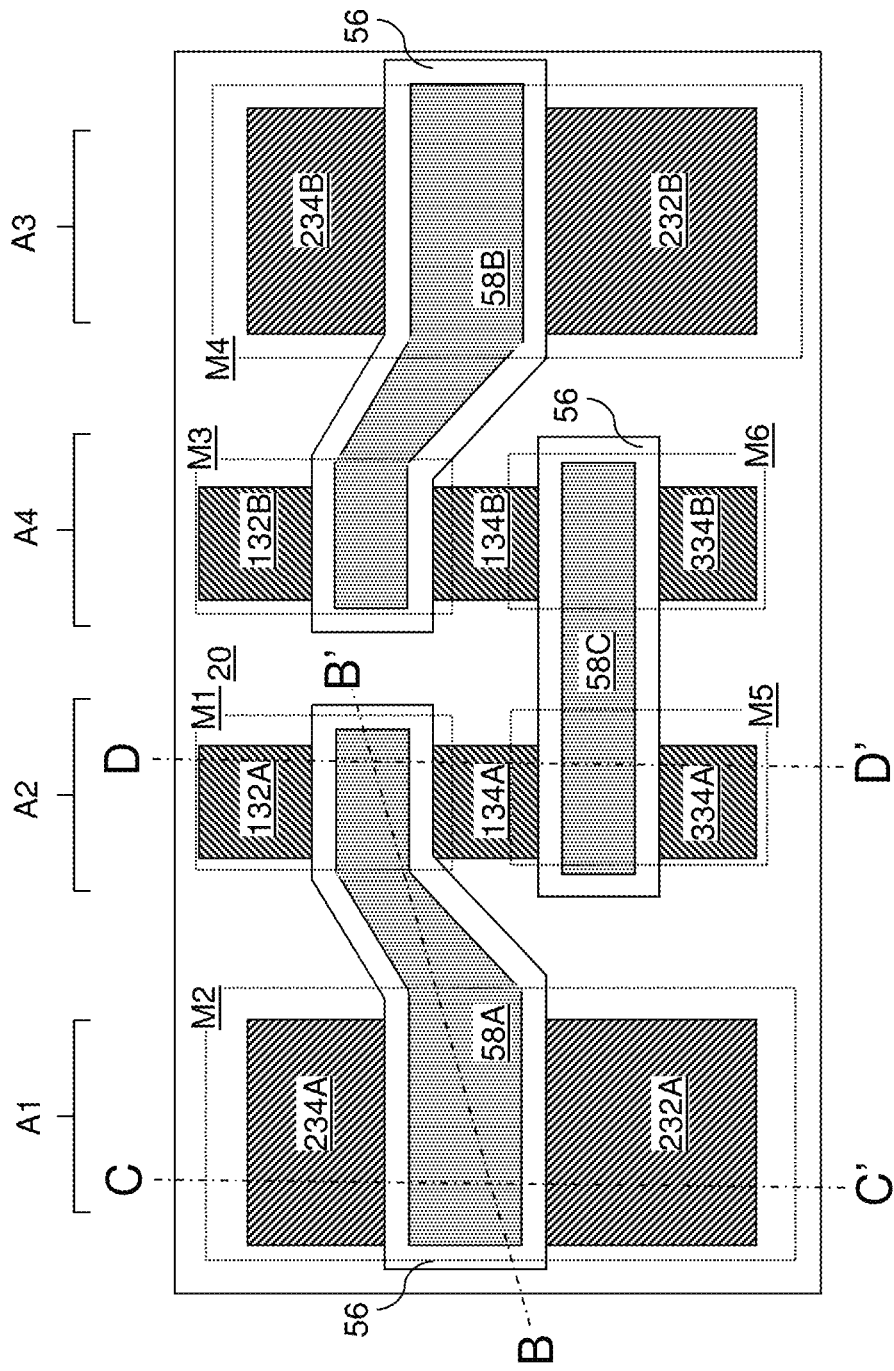
FIG. 6A is a top-down view of the first exemplary structure after forming source and drain regions and gate spacers according to an embodiment of the present disclosure.
Figure 6B:
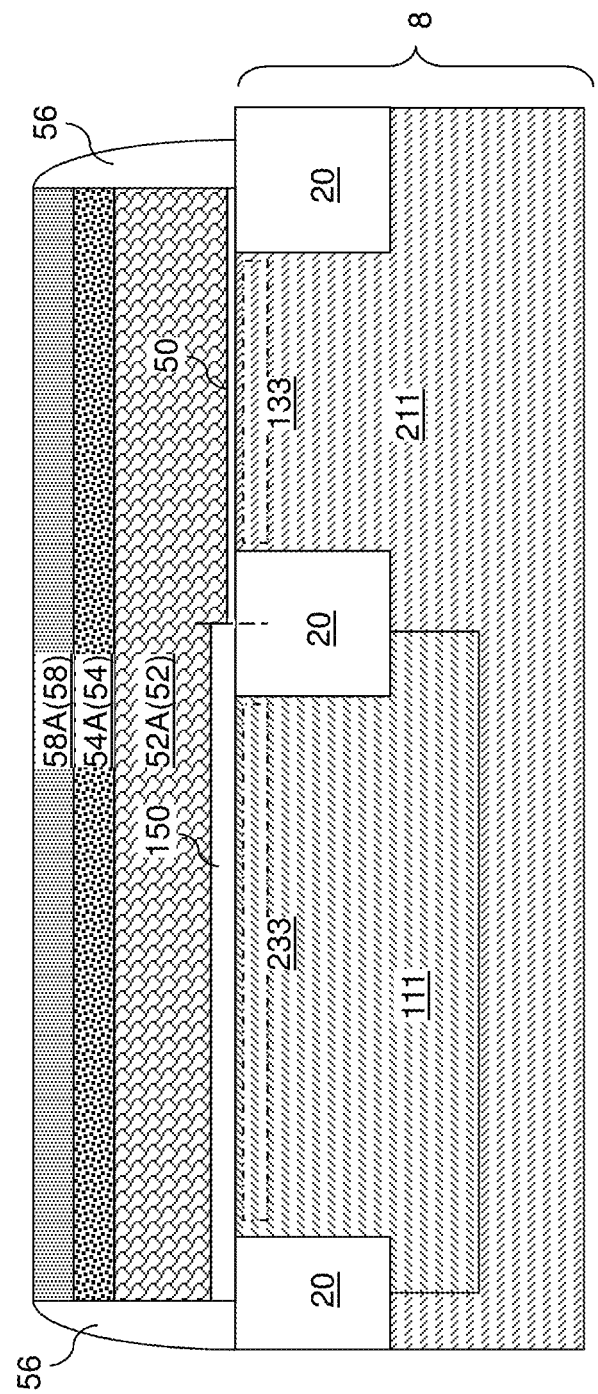
FIG. 6B is a vertical cross-sectional view of the first exemplary structure of FIG. 6A along the vertical plane B-B'.
Figure 6C:
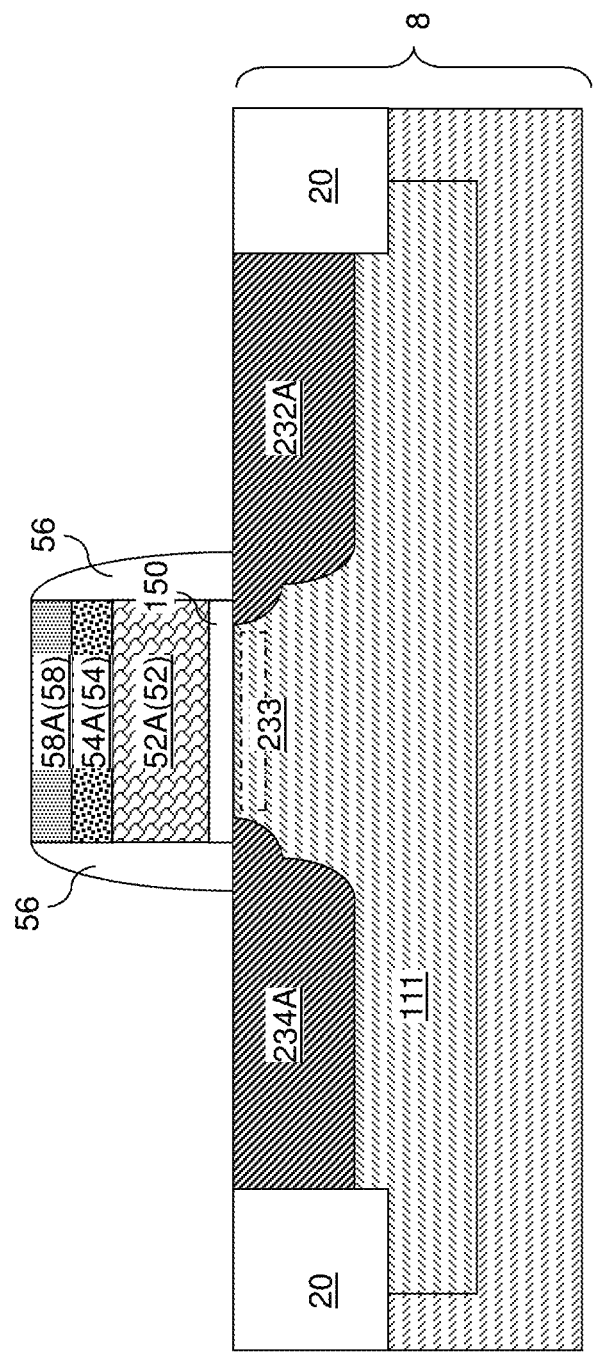
FIG. 6C is a vertical cross-sectional view of the first exemplary structure of FIG. 6A along the vertical plane C-C'.
Figure 6D:
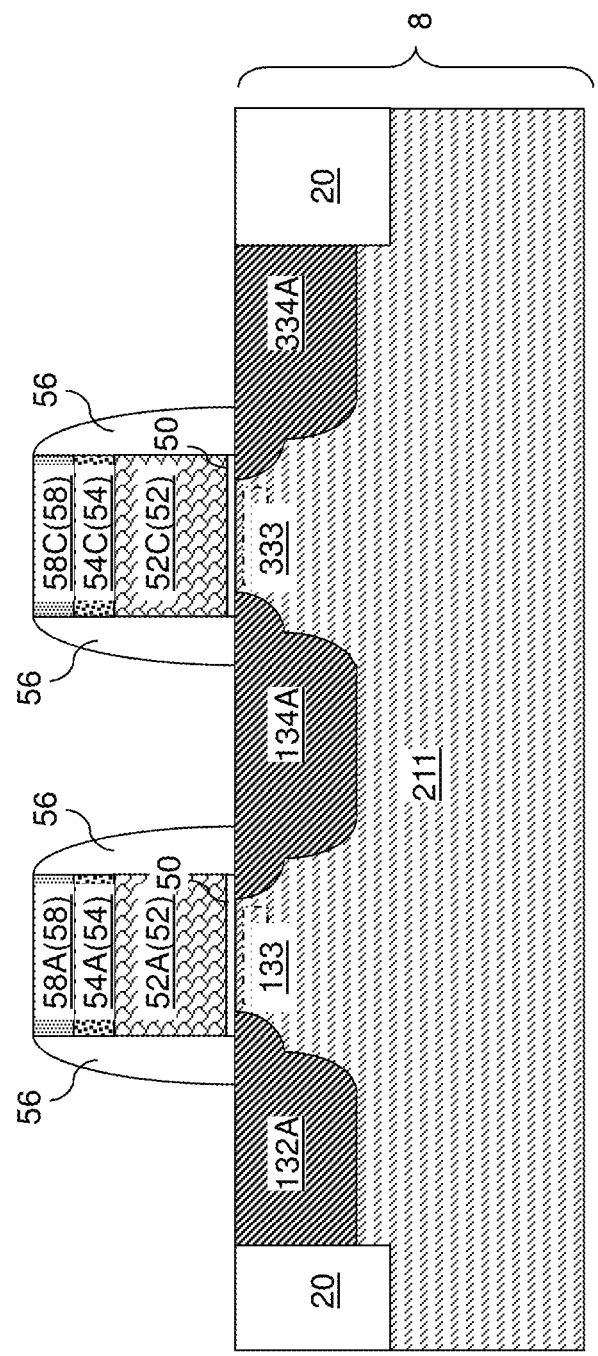
FIG. 6D is a vertical cross-sectional view of the first exemplary structure of FIG. 6A along the vertical plane D-D'.

Referring to FIGS. 4A and 4B, a second-thickness gate dielectric layer 50L can be formed on the top surfaces of the p-doped wells (211, 212). In one embodiment, the second-thickness gate dielectric layer 50L may be formed by thermal conversion or plasma conversion of physically exposed surface portions of the p-doped wells (211, 212) into a dielectric material layer. For example, thermal oxidation, thermal nitridation, plasma oxidation, and/or plasma nitridation can be employed to covert the physically exposed surface portions of the p-doped wells (211, 212) into a dielectric material layer. Alternatively or additionally, the second-thickness gate dielectric layer 50L can be formed by deposition of at least one dielectric material such as silicon oxide and/or a dielectric metal oxide (such as aluminum oxide, hafnium oxide, and/or lanthanum oxide). The gate dielectric layer 50L shown in FIGS. 4A and 4B can be formed by deposition such that the gate dielectric layer 50L covers the isolation structures 20. If the gate dielectric layer 50L is formed by oxidation of the exposed doped wells, then the isolation structures 20 would be located between portions of the gate dielectric layer 50L. The thickness of the second-thickness gate dielectric layer 50L can be in a range from 1.0 nm to 6 nm, such as from 1.2 nm to 3 nm, although lesser and greater thickness can also be employed. In one embodiment, the second-thickness gate dielectric layer 50L can be formed by deposition of a continuous dielectric material layer. Alternatively or additionally, the second-thickness gate dielectric layer 50L can be formed by conversion of the surface portions of the p-doped wells (211, 212) into dielectric material layers. The thickness of the first dielectric layer 150L can increase by addition of material portions within a deposited continuous dielectric material layer and/or by conversion of additional surface portions of the n-doped wells (111, 112) underneath the first-thickness gate dielectric layer 150L as provided at the processing steps of FIGS. 3A and 3B.

Referring to FIGS. 5A-5D, a gate material layer stack can be deposited and patterned to form various gate stack structures (60A, 60B, 60C). The gate material layer stack can include an n-doped semiconductor material layer, an optional gate metal-semiconductor alloy layer, and a gate cap dielectric layer. The gate material layer stack is subsequently patterned to form various gate stack structures (60A, 60B, 60C), for example, by applying and lithographically patterning a photoresist layer (not shown), and by transferring the pattern in the photoresist layer through the gate material layer stack employing an anisotropic etch process in which the patterned photoresist layer is employed as an etch mask. Each gate stack structure (60A, 60B, 60C) is a contiguous structure in which all components therein are contiguous, and includes at least one gate dielectric (50, 150), an n-doped gate electrode 52, an optional metal-semiconductor alloy gate electrode 54, and a gate cap dielectric 58. Each at least one gate dielectric (50, 150) is a patterned portion of the first-thickness gate dielectric layer 150L and/or the second-thickness gate dielectric layer 50L. Each n-doped gate electrode 52 is a patterned portion of the n-doped semiconductor material layer. Each metal-semiconductor alloy gate electrode 54 is a patterned portion of the gate metal-semiconductor alloy layer. Each gate cap dielectric 58 is a patterned portion of the gate cap dielectric layer.

The n-doped gate electrodes 52 include an n-doped semiconductor material, which can be a heavily doped semiconductor material, i.e., an n-doped semiconductor material including n-type dopant atoms to provide conductivity greater than $1.0 \times 10^5$ S/cm as formed or upon a suitable anneal process (which may convert an amorphous phase into a polycrystalline phase). In one embodiment, the n-doped semiconductor material layer can include amorphous silicon, polysilicon, or a silicon-germanium alloy, and can include n-type dopants at an atomic concentration in a range from $5.0 \times 10^{19}/cm^3$ to $2.0 \times 10^{21}/cm^3$. The n-type dopants can include phosphorus, arsenic, and/or antimony. The thickness of the n-doped gate electrodes 52 can be in a range from 30 nm to 300 nm, such as from 50 nm to 200 nm, although lesser and greater thicknesses can also be employed.

The optional metal-semiconductor alloy gate electrodes 54 include an alloy of a semiconductor material and a metal such as a metal silicide (e.g., tungsten or titanium silicide). The thickness of the metal-semiconductor alloy gate electrodes 54 can be in a range from 30 nm to 150 nm, such as from 50 nm to 100 nm, although lesser and greater thicknesses can also be employed. The gate cap dielectrics 58 includes a dielectric material such as silicon nitride or silicon oxide. The thickness of the gate cap dielectrics 58 can be in a range from 30 nm to 100 nm, such as from 40 nm to 80 nm, although lesser and greater thicknesses can also be employed.

The gate stack structure (60A, 60B, 60C) can include a first gate stack structure 60A including a combination of a first-thickness gate dielectric 150 and a second-thickness gate dielectric 50, a first n-doped gate electrode 52A, an optional first metal-semiconductor alloy gate electrode 54A, and a first gate cap dielectric 58A. The first-thickness gate dielectric 150 is located in the first p-type pull-up transistor M2, while the second-thickness gate dielectric 50 is located in the first n-type pull-down transistor M1. The first and second p-type pull-up transistors (M2, M4), the first and second n-type pull-down transistors (M1, M3) and the first and second pass gate transistors (M5, M6) shown in FIG. 5A correspond to the respective similarly numbered transistors shown in the circuit schematic of FIG. 1.

The first gate stack structure 60A extends across the first active area A1 defined by a closed periphery including vertical or substantially vertical interfaces between the first n-type well 111 and the shallow trench isolation structure 20, across the second active area A2 defined by a closed periphery including vertical or substantially vertical interfaces between the first p-type well 211 and the shallow trench isolation structure 20, and across a portion of the shallow trench isolation structure 20 located between the first active area A1 and the second active area A2. The first n-doped gate electrode 52A comprises an n-doped gate electrode portion of a first p-type pull-up transistor M2 to be formed in the first active area A1, an n-doped gate electrode portion of a first n-type pull-down transistor M1 to be formed in the second active area A2, and a connection region of the first n-doped gate electrode that continuously extends between the n-doped gate electrode portion of the first p-type pull-up transistor M2 and the n-doped gate electrode portion of the first n-type pull-down transistor M1. The connection region overlies a portion of the shallow trench isolation structure 20 located between the first active area A1 and the second active area A2.

In one embodiment, the n-doped gate electrode portion of the first p-type pull-up transistor M2 has a first uniform width, and the n-doped gate electrode portion of the first n-type pull-down transistor M1 has a second uniform width that is less than the first uniform width. The first uniform width can be substantially the same as the gate length of the first pull-up transistor M2, and can be measured along the direction of the current flow in the channel of the first pull-up transistor M2. The second uniform width can be substantially the same as the gate length of the first pull-down transistor M1, and can be measured along the direction of the current flow in the channel of the first pull-down transistor M1. The connection region of the first n-doped gate electrode 52A can have a tapered width that changes from the first uniform width to the second uniform width.

The thickness differential between the first-thickness gate dielectric 150 of the first p-type pull-up transistor M2 and the second-thickness gate dielectric 50 of the first n-type pull-down transistor M1, as well as the width differential between the n-doped gate electrode portion of the first p-type pull-up transistor M2 and the n-doped gate electrode portion of the first n-type pull-down transistor M1 can be advantageously employed to increase the write margin of the SRAM of one embodiment present disclosure. Substitution of an n-doped semiconductor material for the gate electrode of the p-type pull-up transistors (M2, M4) adversely affects the threshold voltage of the p-type pull-up transistors. Use of a greater thickness for the gate dielectric 150L and a greater gate length for the p-type pull-up transistors (M2, M4) than the n-type pull-down transistors (M1, M3) compensates for the shift in the threshold voltage of the p-type pull-up transistors (M2, M4), and thus, increases the write margin of the SRAM cell of one embodiment of the present disclosure.

The gate stack structure (60A, 60B, 60C) can include a second gate stack structure 60B including a combination of a second-thickness gate dielectric 150 and a second-thickness gate dielectric 50, a second n-doped gate electrode 52, an optional second metal-semiconductor alloy gate electrode 54, and a second gate cap dielectric 58B. The second gate stack structure 60B extends across the third active area A3 defined by a closed periphery including vertical or substantially vertical interfaces between the second n-type well 112 and the shallow trench isolation structure 20, across the fourth active area A4 defined by a closed periphery including vertical or substantially vertical interfaces between the second p-type well 212 and the shallow trench isolation structure 20, and across a portion of the shallow trench isolation structure 20 located between the third active area A3 and the fourth active area A4. The second n-doped gate electrode 52 comprises an n-doped gate electrode portion of a second p-type pull-up transistor M4 to be formed in the third active area A3, an n-doped gate electrode portion of a second n-type pull-down transistor M3 to be formed in the fourth active area A4, and a connection region of the second n-doped gate electrode that continuously extends between the n-doped gate electrode portion of the second p-type pull-up transistor M4 and the n-doped gate electrode portion of the second n-type pull-down transistor M3. The connection region overlies a portion of the shallow trench isolation structure 20 located between the third active area and the fourth active area.

In one embodiment, the n-doped gate electrode portion of the second p-type pull-up transistor M4 has the first uniform width, and the n-doped gate electrode portion of the second n-type pull-down transistor M3 has the second uniform width. The first uniform width can be substantially the same as the gate length of the second pull-up transistor M4, and can be measured along the direction of the current flow in the channel of the second pull-up transistor M4. The second uniform width can be substantially the same as the gate length of the second pull-down transistor M3, and can be measured along the direction of the current flow in the channel of the second pull-down transistor M3. The connection region of the second n-doped gate electrode 52 can have a tapered width that changes from the first uniform width to the second uniform width.

The gate stack structure (60A, 60B, 60C) can include a third gate stack structure 60C including a second-thickness gate dielectric 50 (and not including any first-thickness gate dielectric), a third n-doped gate electrode 52C, an optional third metal-semiconductor alloy gate electrode 54C, and a third gate cap dielectric 58C. The third gate stack structure 60C extends across the second active are A2, across the fourth active area A4, and across a portion of the shallow trench isolation structure 20 located between the second active area A2 and the fourth active area A4. The third n-doped gate electrode 52C comprises an n-doped gate electrode portion of a first pass gate transistor M5 to be formed in the second active area A2, an n-doped gate electrode portion of a second pass gate transistor M6 to be formed in the fourth active area A4, and a connection region of the third n-doped gate electrode that continuously extends between the n-doped gate electrode portion of the first pass gate transistor M5 and the n-doped gate electrode portion of the second pass gate transistor M6. The connection region overlies a portion of the shallow trench isolation structure 20 located between the second active area A2 and the fourth active area A4.

Referring to FIGS. 6A-6D, various lightly doped extension regions are formed by masked ion implantation processes. Each masked ion implantation process can employ a combination of a respective patterned photoresist layer and the various gate stack structures (60A, 60B, 60C) as an implantation mask. Halo implantations can be performed employing angled ion implantation processes as needed. Dielectric gate spacers 56 can be formed around each gate stack structure (60A, 60B, 60C) by conformal deposition of a dielectric material layer and an anisotropic etch process that etches horizontal portions of the dielectric material layer. Additional masked ion implantation processes can be performed to form deep source regions and deep drain regions.

The p-type dopants implanted into the n-type wells (111, 112) form various p-doped active regions (232A, 234A, 232B, 234B), which include a first p-doped source region 232A, a first p-doped drain region 234A, a second p-doped source region 232B, and a second p-doped drain region 234B. It is understood that each neighboring pair of a lightly doped extension region and a deep source/drain region merge to form a single transistor active region, i.e., a source region or a drain region. The atomic concentration of p-type dopants in the various p-doped active regions (232A, 234A, 232B, 234B) can be in a range from $1.0 \times 10^{19}/cm^3$ to $2.0 \times 10^{21}/cm^3$, although lesser and greater atomic concentrations can also be employed.

The n-type dopants implanted into the p-type wells (211, 212) form various n-doped active regions (132A, 134A, 334A, 132B, 134B, 334B), which include a first n-doped source region 132A, a first n-doped drain region 134A, a first pass gate active region 334A, a second n-doped source region 132B, a second n-doped drain region 134B, a second pass gate active region 334B. The atomic concentration of n-type dopants in the various n-doped active regions (132A, 134A, 334A, 132B, 134B, 334B) can be in a range from $1.0 \times 10^{19}/cm^3$ to $2.0 \times 10^{21}/cm^3$, although lesser and greater atomic concentrations can also be employed.

A pull-up transistor channel region 233 having an n-type doping is formed underneath a respective first-thickness gate dielectric 150 in each of the first and third active areas (A1, A3). A pull-down transistor channel region 133 having a p-type doping is formed underneath a respective second-thickness gate dielectric 50 in each of the second and fourth active regions (A2, A4). A pass gate transistor channel region 333 having a p-type doping is formed underneath a respective additional second-thickness gate dielectric 50 in each of the second and fourth active regions (A2, A4).

Referring to FIGS. 7A-7D, a dielectric material such as silicon oxide can be deposited over the gate stack structures, and can be planarized to provide a horizontal top surface. The deposited and planarized dielectric material constitutes a planarization dielectric layer 70. Various via cavities can be formed through the planarization dielectric layer 70 to the top surfaces of the various p-doped active regions (232A, 234A, 232B, 234B), the various n-doped active regions (132A, 134A, 334A, 132B, 134B, 334B), and the metal-semiconductor alloy gate electrodes 54 (or the n-doped gate electrodes 52 in case the metal-semiconductor alloy gate electrodes 54 are omitted).

Metal-semiconductor alloy portions 78 can be optionally formed on the top surfaces of the various p-doped active regions (232A, 234A, 232B, 234B) and the various n-doped active regions (132A, 134A, 334A, 132B, 134B, 334B) by depositing a metal layer, inducing a reaction between the semiconductor material of the various doped active regions, and removing unreacted portions of the metal layer. In one embodiment, the metal-semiconductor alloy portions 78 can include a metal silicide such as nickel silicide, nickel-platinum silicide, cobalt silicide, titanium silicide, or tungsten silicide.

At least one conductive material can be deposited in remaining volumes of the via cavities and planarized to form various contact via structures (72, 74, 75). The top surfaces of the various contact via structures (72, 74, 75) can be coplanar with the top surface of the planarization dielectric layer 70. The various contact via structures (72, 74, 75) can include active region contact via structures 72 that provide electrical contact to a respective one of the various p-doped active regions (232A, 234A, 232B, 234B) and the various n-doped active regions (132A, 134A, 334A, 132B, 134B, 334B), at least one active region contact bar structure 74 that contacts two or more of the various p-doped active regions (232A, 234A, 232B, 234B) and the various n-doped active regions (132A, 134A, 334A, 132B, 134B, 334B) simultaneously, and gate contact via structures 75 that contacts a respective one of the metal-semiconductor alloy gate electrodes 54 (or a respective one of the n-doped gate electrodes 52 in case the metal-semiconductor alloy gate electrodes 54 are omitted).

Figure 7A:
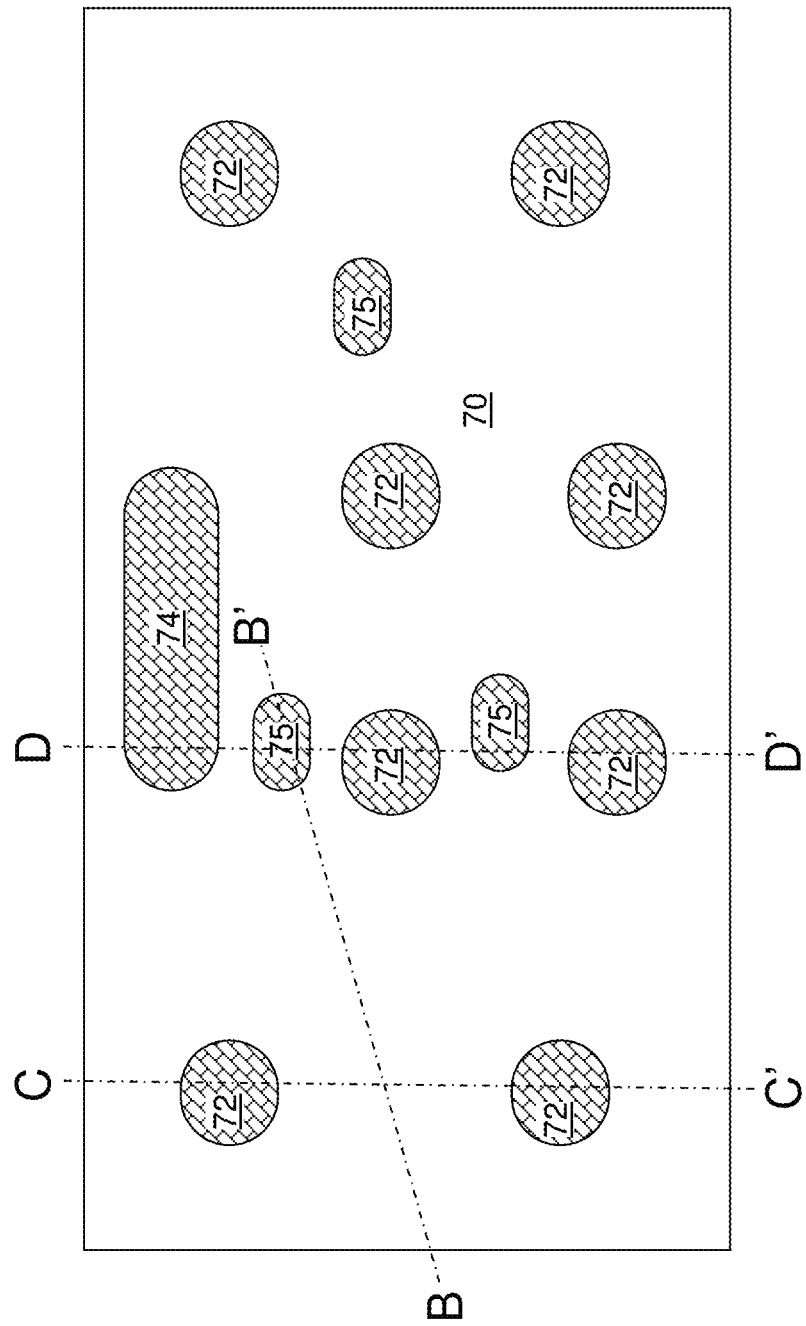
FIG. 7A is a top-down view of the first exemplary structure after forming a planarization dielectric layer and various contact via structures according to an embodiment of the present disclosure.
Figure 7B:
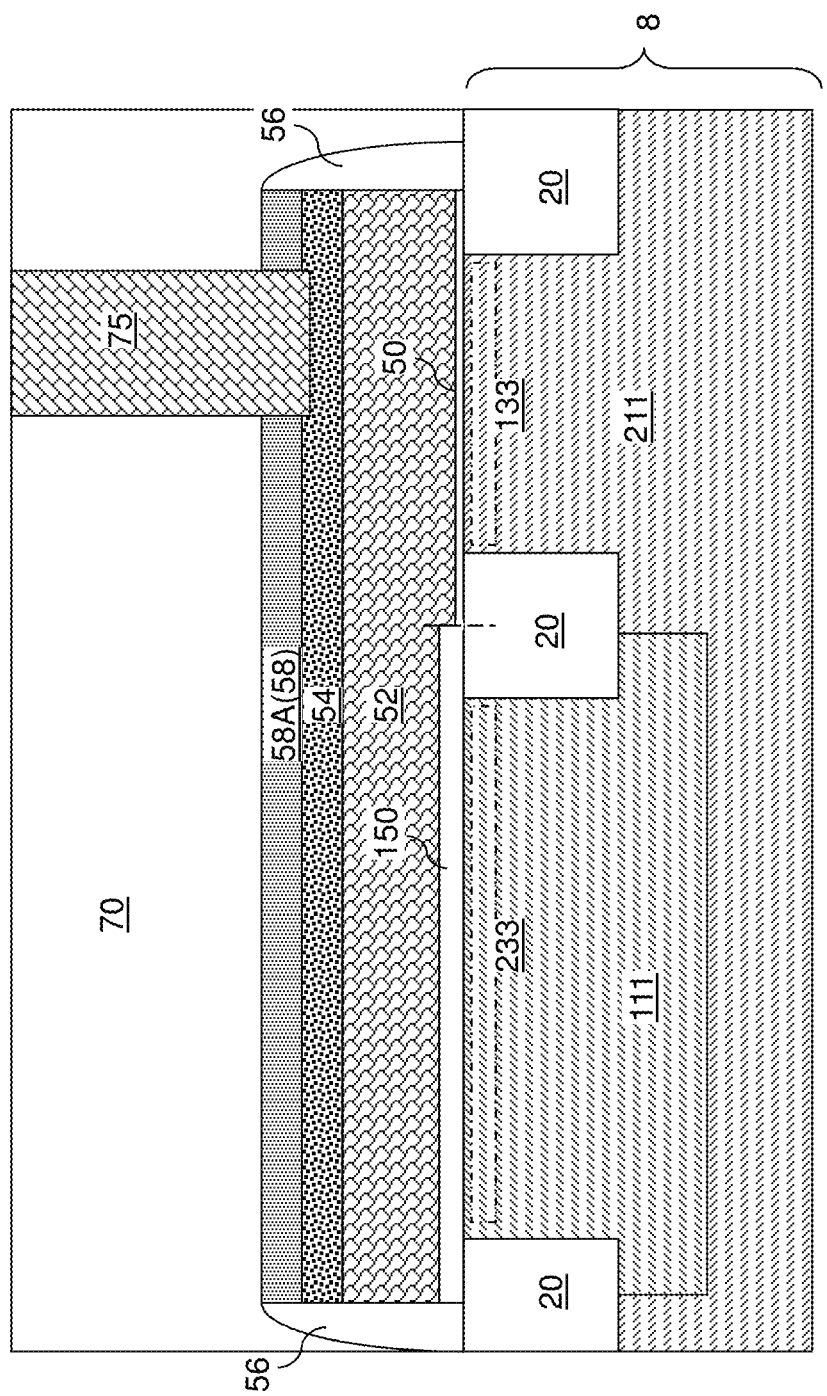
FIG. 7B is a vertical cross-sectional view of the first exemplary structure of FIG. 7A along the vertical plane B-B'.
Figure 7D:
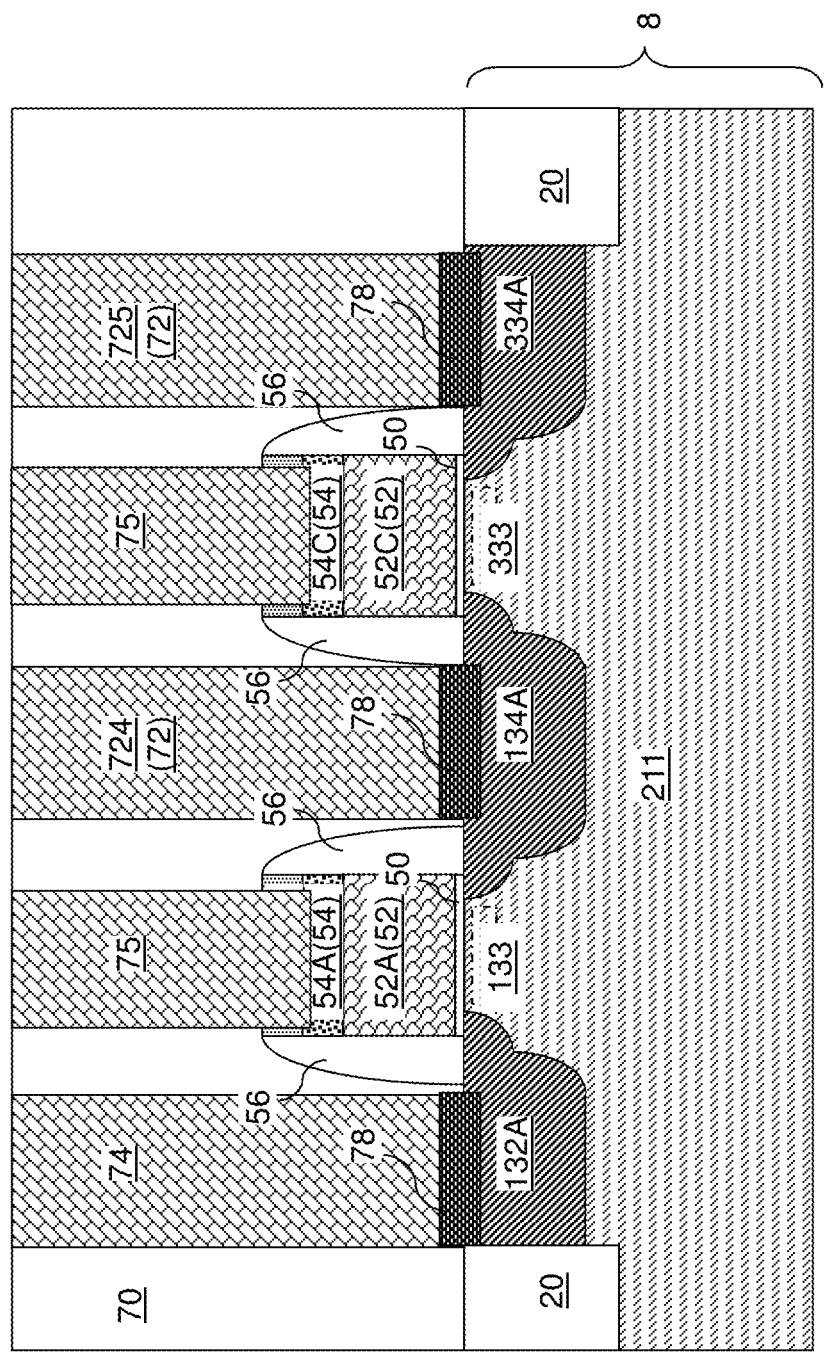
FIG. 7D is a vertical cross-sectional view of the first exemplary structure of FIG. 7A along the vertical plane D-D'.
Figure 8A:
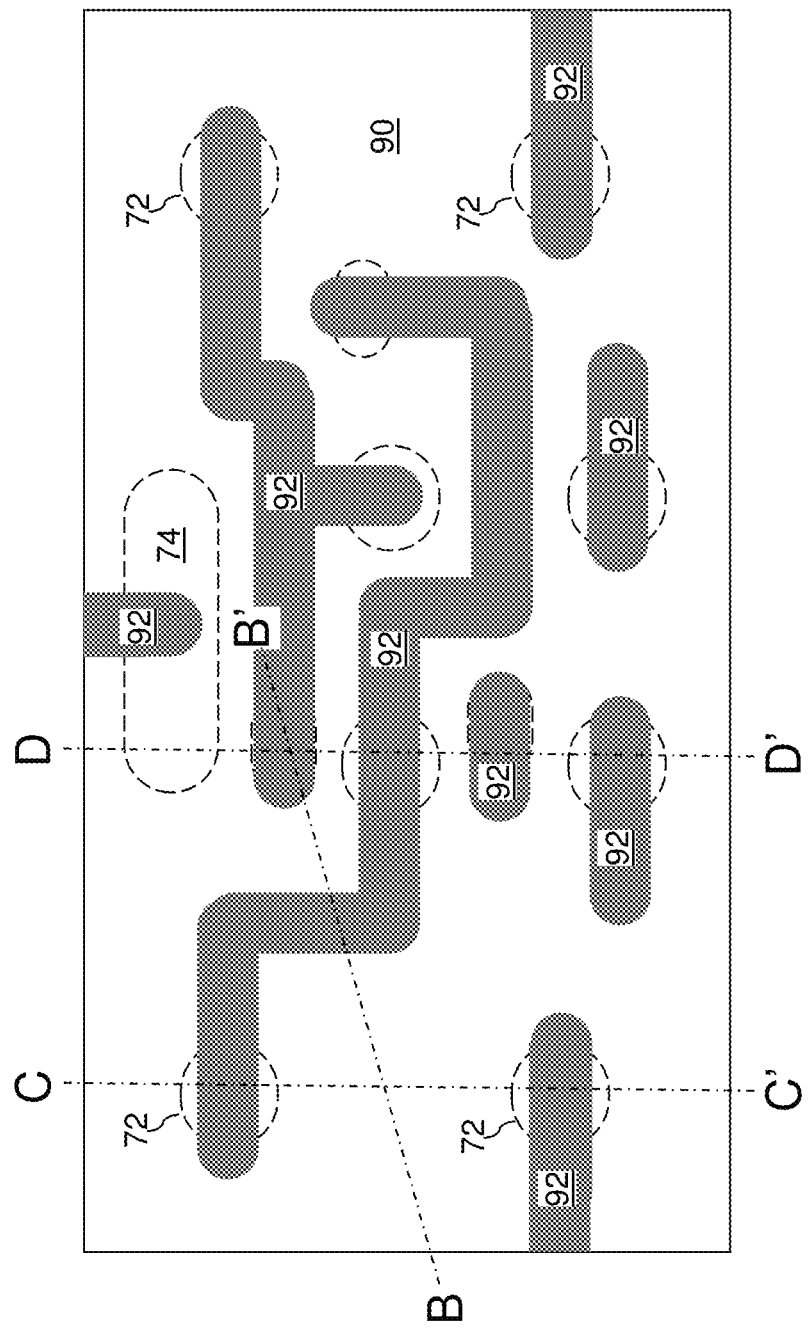
FIG. 8A is a top-down view of the first exemplary structure after forming metal line structures according to an embodiment of the present disclosure.
Figure 8B:
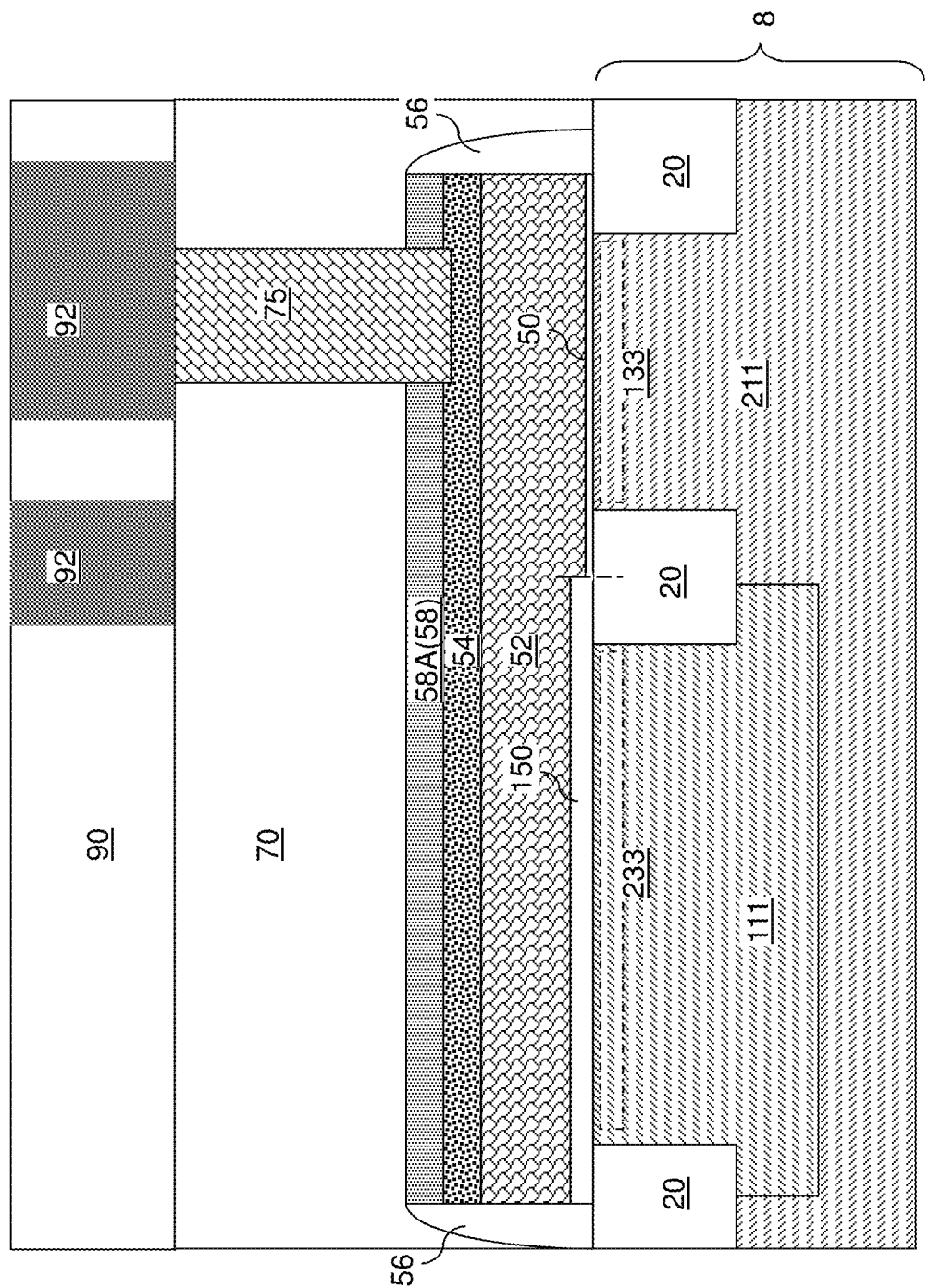
FIG. 8B is a vertical cross-sectional view of the first exemplary structure of FIG. 8A along the vertical plane B-B'.
Figure 8C:
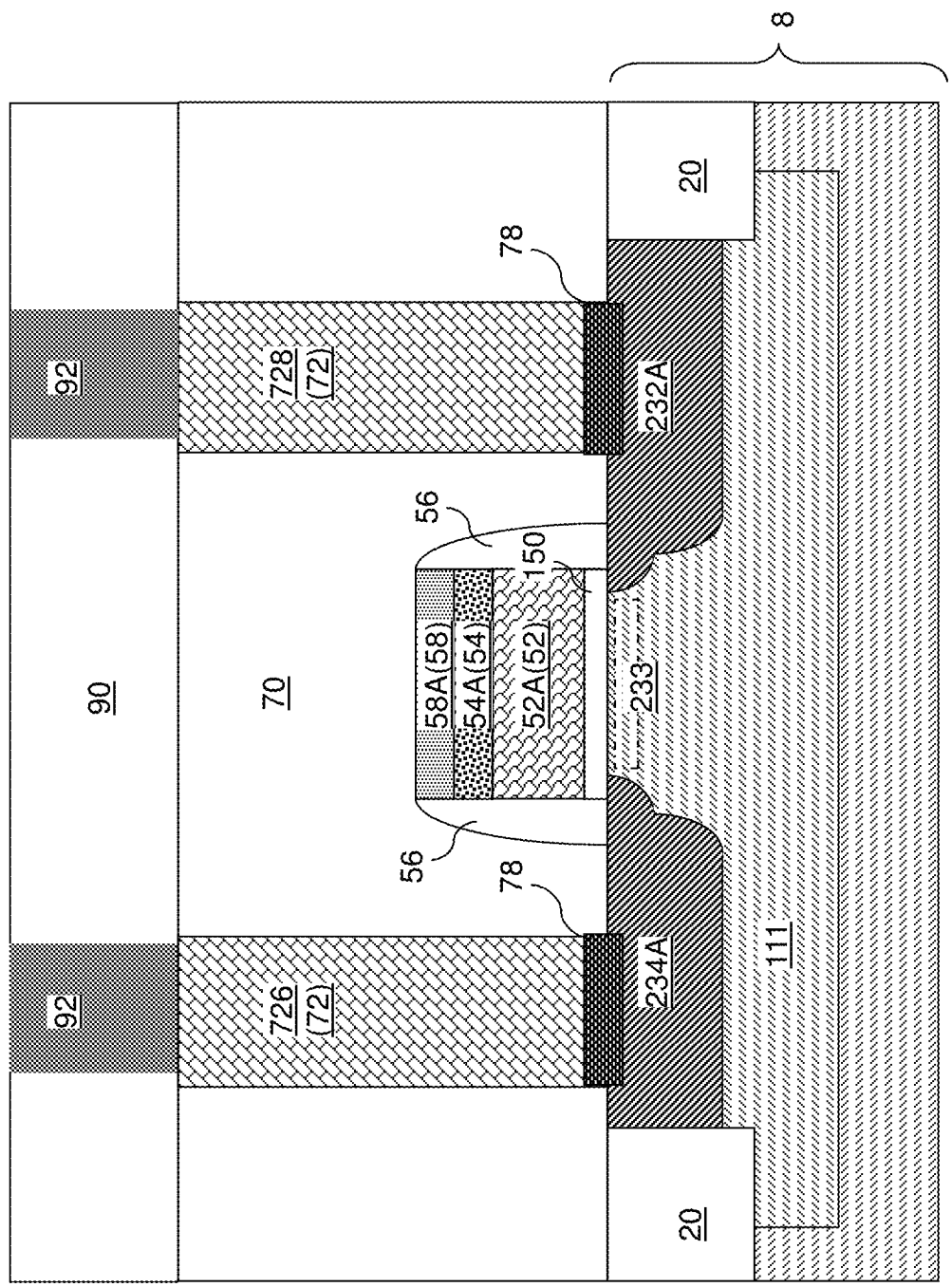
FIG. 8C is a vertical cross-sectional view of the first exemplary structure of FIG. 8A along the vertical plane C-C'.
Figure 8D:
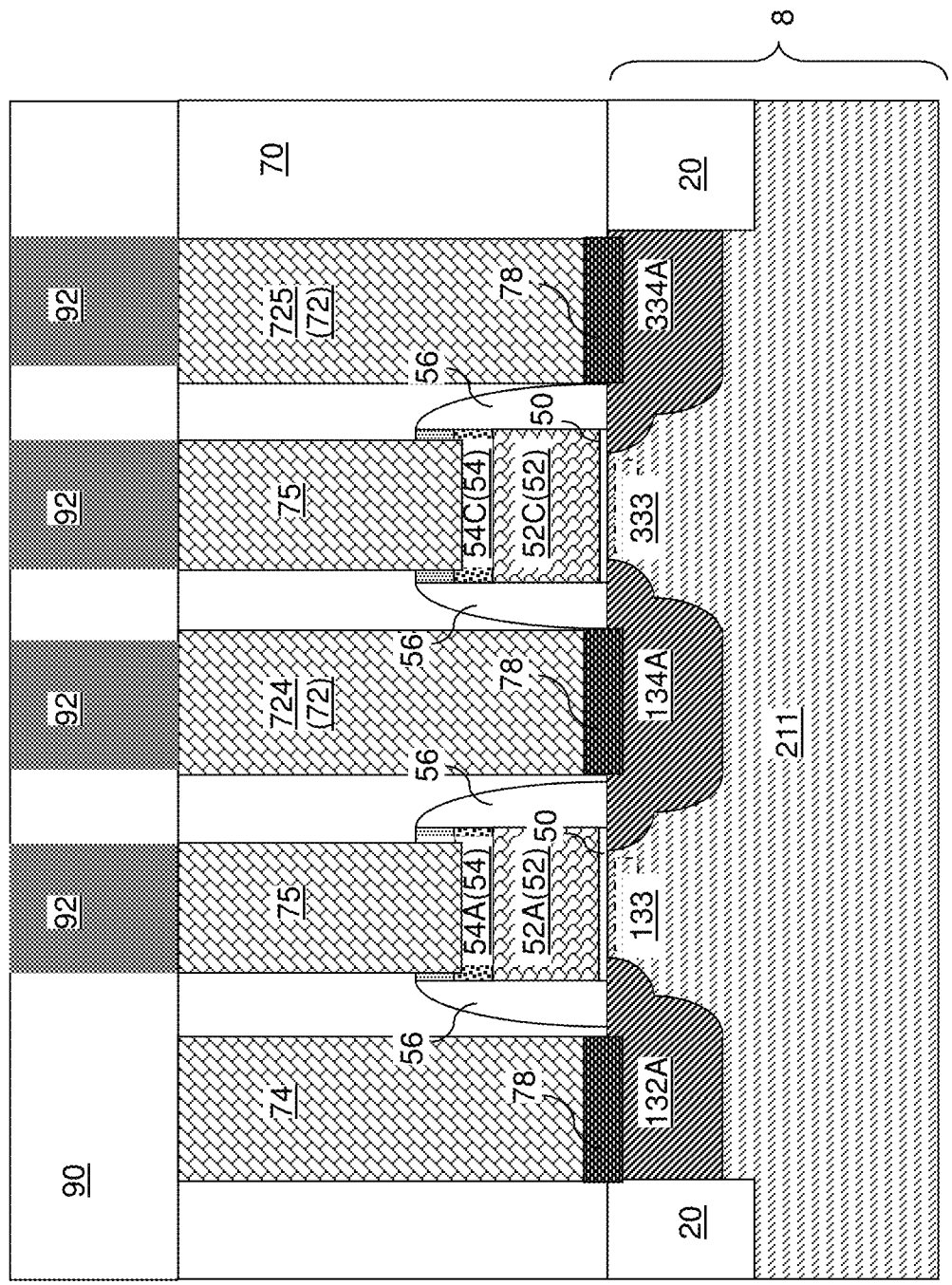
FIG. 8D is a vertical cross-sectional view of the first exemplary structure of FIG. 8A along the vertical plane D-D'.
Figure 9A:
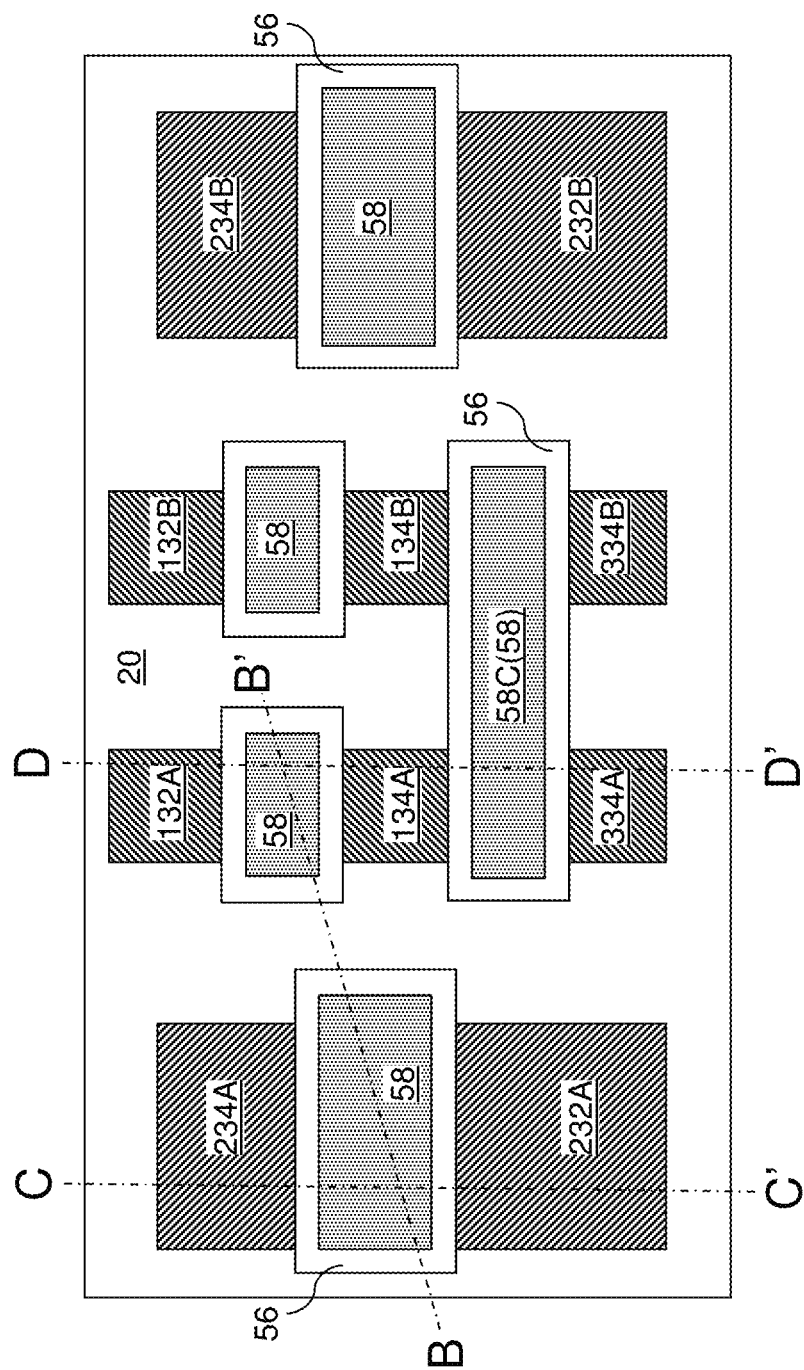
FIG. 9A is a top-down view of a second exemplary structure after forming source and drain regions and gate spacers according to an embodiment of the present disclosure.
Figure 9B:
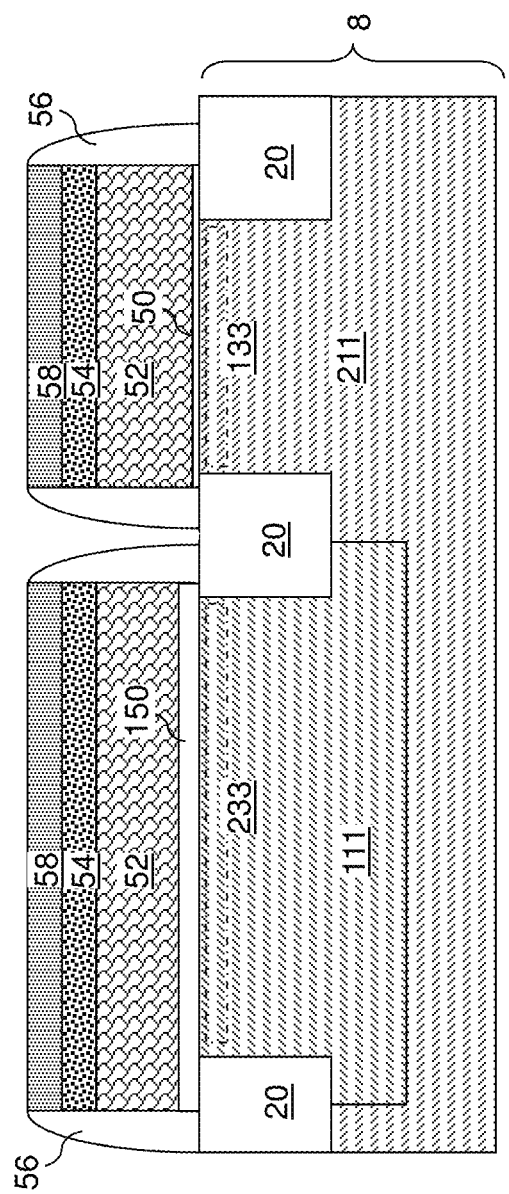
FIG. 9B is a vertical cross-sectional view of the second exemplary structure of FIG. 9A along the vertical plane B-B'.
Figure 9C:
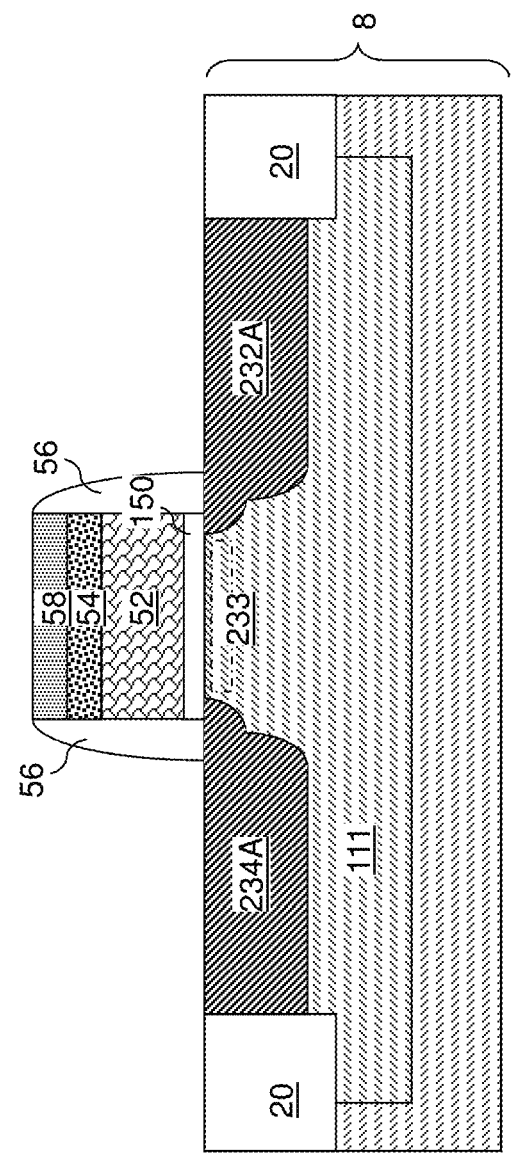
FIG. 9C is a vertical cross-sectional view of the second exemplary structure of FIG. 9A along the vertical plane C-C'.
Figure 9D:
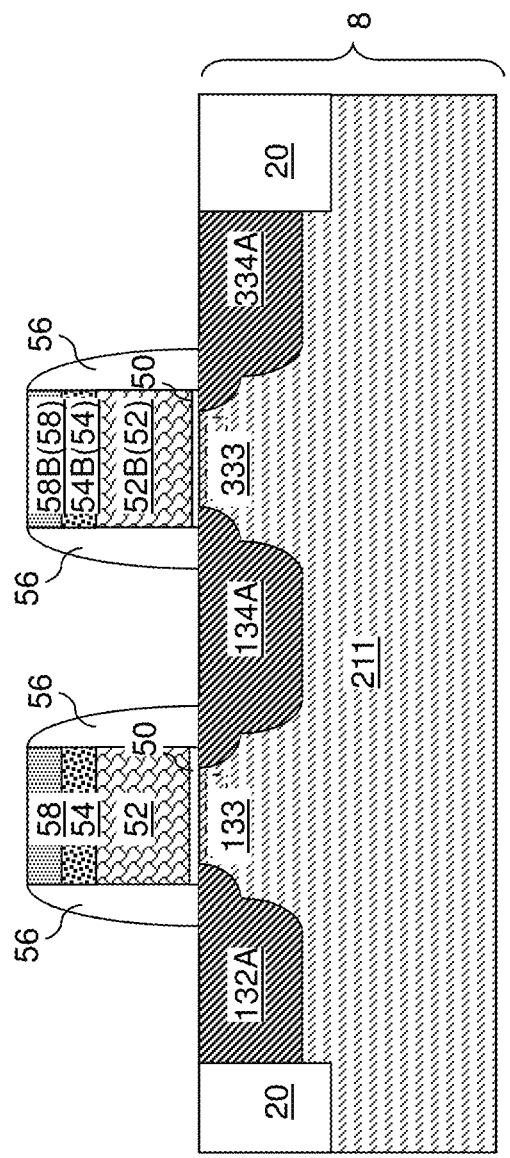
FIG. 9D is a vertical cross-sectional view of the second exemplary structure of FIG. 9A along the vertical plane D-D'.
Figure 10A:
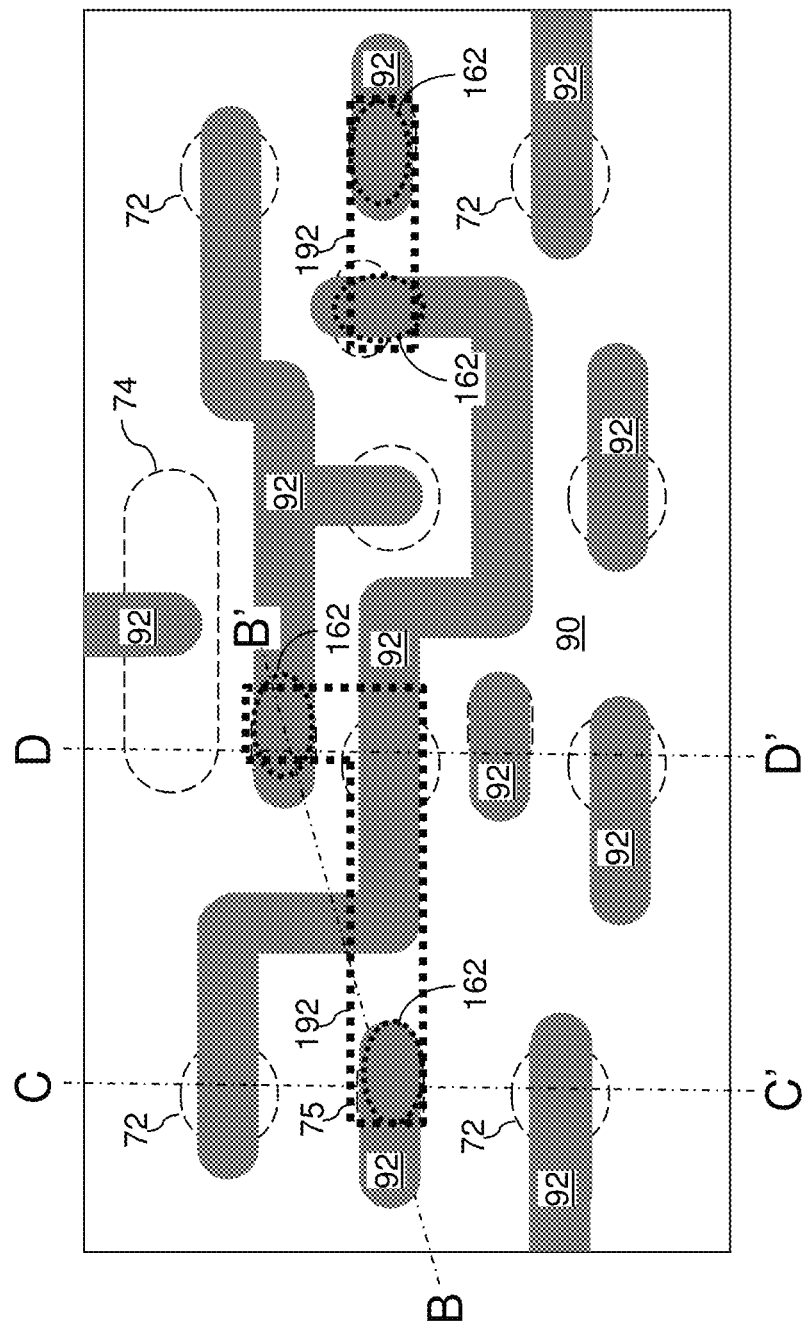
FIG. 10A is horizontal cross-sectional view along the vertical plane A-A' in FIGS. 10B-10D of the second exemplary structure after forming metal line structures according to an embodiment of the present disclosure. Various overlying and underlying structures at different overlying and underlying levels are shown in dashed lines to illustrate the relative lateral positions relative to the structures embedded in the first line-level dielectric layer 90.
Figure 10B:
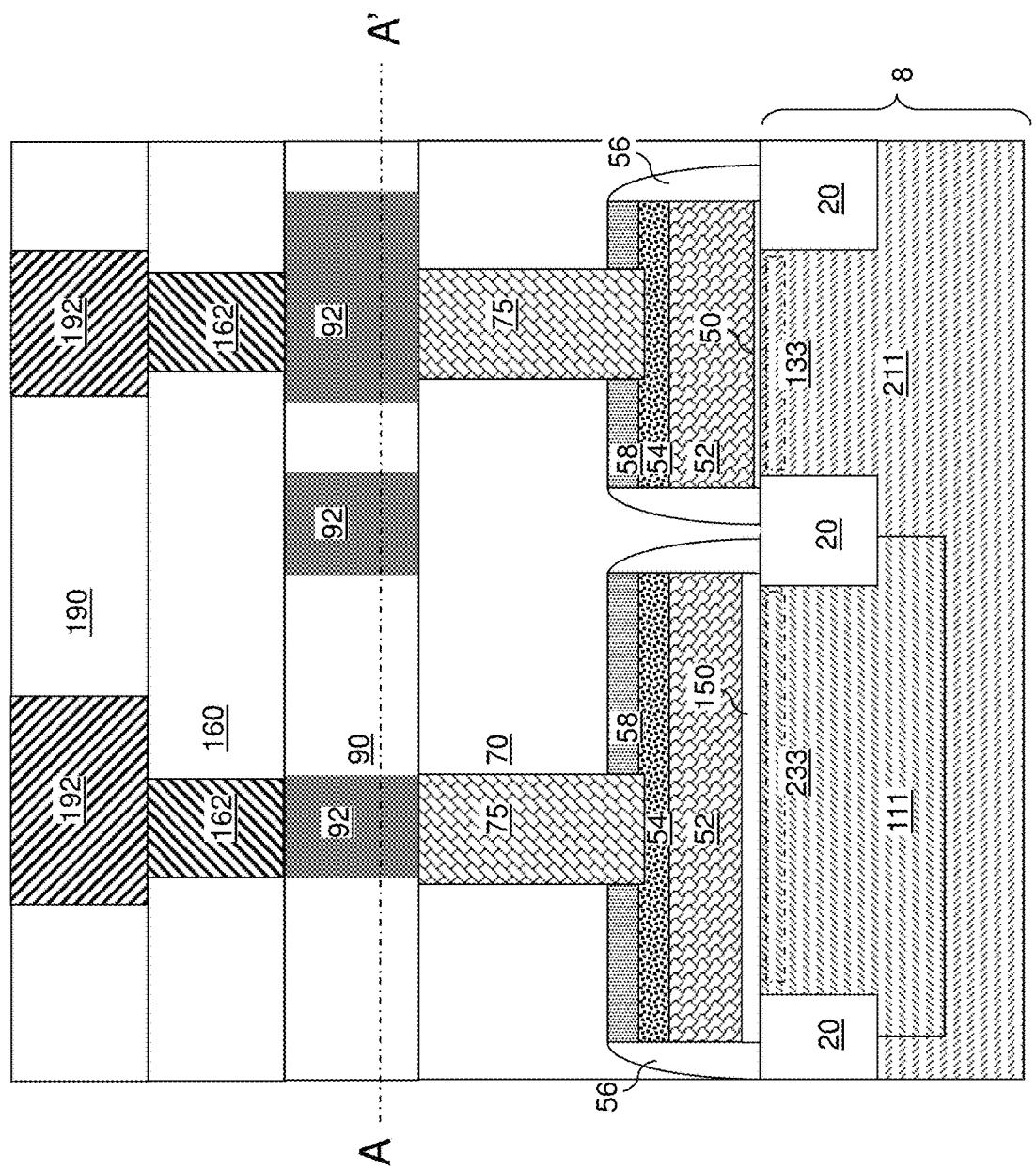
FIG. 10B is a vertical cross-sectional view of the second exemplary structure of FIG. 10A along the vertical plane B-B'.
Figure 10C:
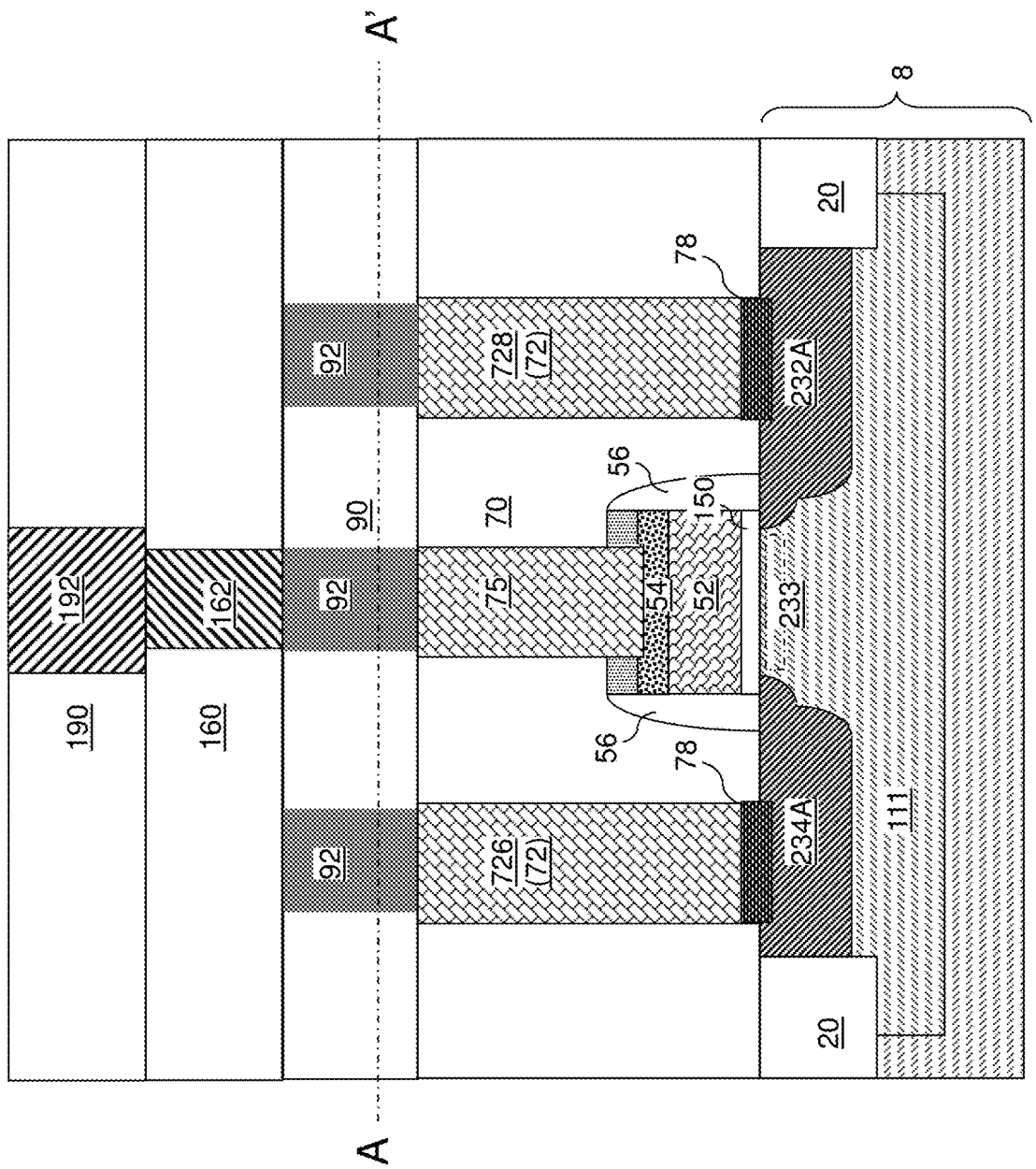
FIG. 10C is a vertical cross-sectional view of the second exemplary structure of FIG. 10A along the vertical plane C-C'.
Figure 10D:
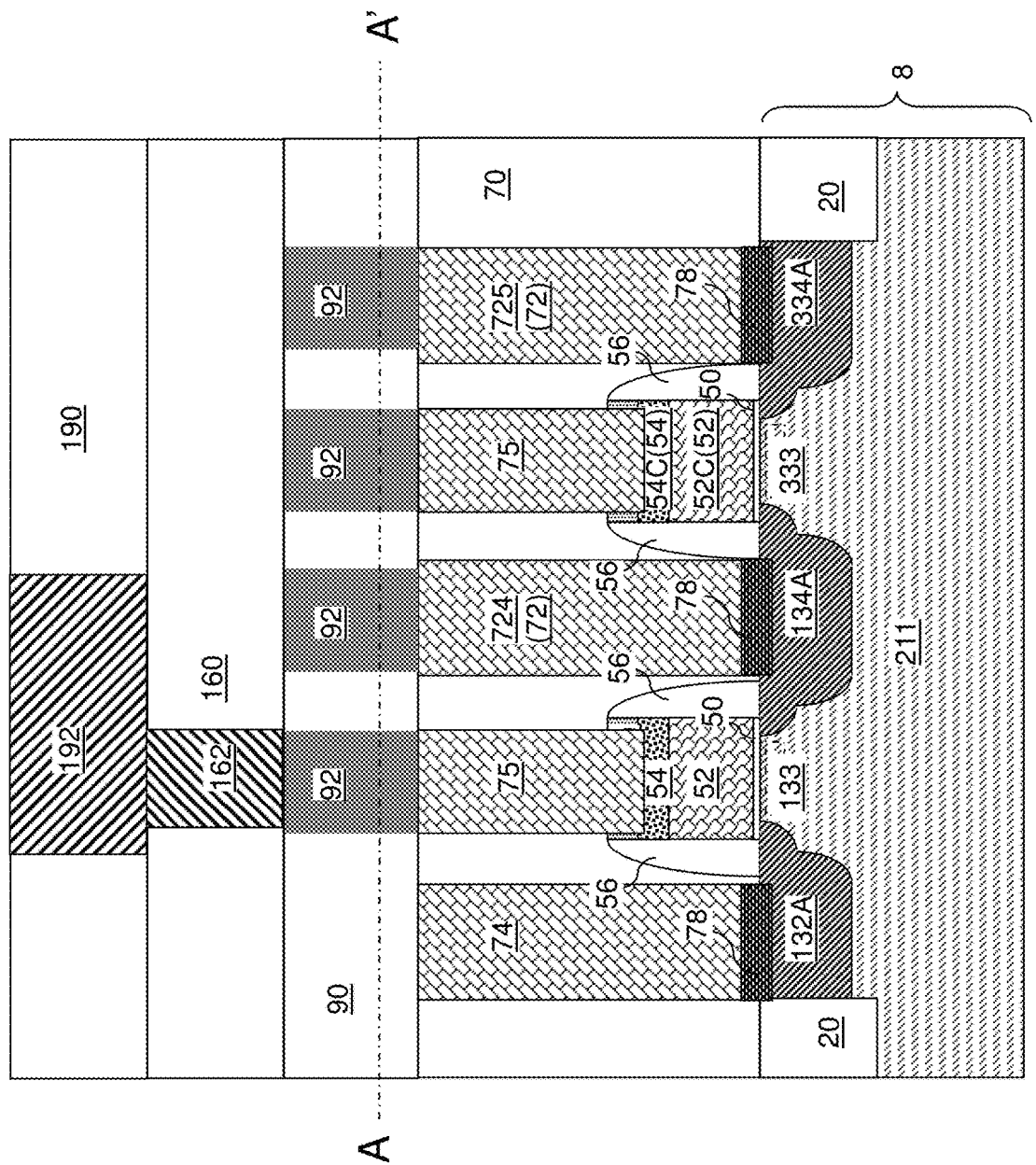
FIG. 10D is a vertical cross-sectional view of the second exemplary structure of FIG. 10A along the vertical plane D-D'.

In an illustrative example shown in FIGS. 7C and 7D, the active region contact via structures 72 can include a pull-up transistor source contact via structure 728, a pull-up transistor drain contact via structure 726, a pull-down transistor drain contact via structure 724, and a pass gate transistor active region contact via structure 725. An active region contact bar structure 74 can contact the first n-doped source region 132A, the second n-doped source region 132B, and a portion of the shallow trench isolation structure located between the first n-doped source region 132A and the second n-doped source region 132B.

Referring to FIGS. 8A-8D, a first line-level dielectric layer 90 can be deposited over the planarization dielectric layer 70. The first line-level dielectric layer 90 can include any dielectric material that can be employed as an interlayer dielectric material. For example, the first line-level dielectric layer 90 can include doped silicate glass, undoped silicate glass, organosilicate glass, and/or a porous dielectric material. A dielectric liner such as a silicon nitride liner may be employed as needed.

First metal line structures 92 can be formed in the first line-level dielectric layer 90, for example, by patterning line trenches through the first line-level dielectric layer 90, and by depositing at least one conductive material in the line trenches. Top surfaces of the various contact via structures (72, 74, 75) can be physically exposed at the bottom of the line trenches prior to deposition of the at least one conductive material. The at least one conductive material can be planarized employing the top surface of the first line-level dielectric layer 90 as a planarization surface. Remaining portions of the at least one conductive material in the line trenches constitute the first metal line structures 92, which provide lateral interconnection among the various contact via structures (72, 74, 75). In other words, the combination of the various contact via structures (72, 74, 75) and the first metal line structures 92 provide electrical wiring of the various nodes of the SRAM. While a particular layout for the various contact via structures (72, 74, 75) and the first metal line structures 92 is employed for the purpose of illustrating an embodiment of the present disclosure, it is understood that the layout of the various contact via structures (72, 74, 75) and the first metal line structures 92 can be optimized as needed, and various other layouts can be employed to implement the present invention. Such layout variations are expressly contemplated herein.

Referring to FIGS. 9A-9D, a second exemplary structure according to a second embodiment of the present disclosure can be derived from the first exemplary structure of FIGS. 4A and 4B by performing the processing steps of FIGS. 5A-5D with a different pattern for the gate stack structures. Specifically, each gate stack structure for the respective field effect transistor is formed as a discrete structure that is not adjoined to any other gate stack structure for other field effect transistors. While formation of a discrete gate stack structure for each field effect transistor reduces areal efficiency of the layout, use of only an n-doped semiconductor material for the n-doped gate electrodes 52 and elimination of p-doped gate electrodes provides advantage in manufacturing through elimination of processing steps for forming p-doped gate electrodes. Subsequently, the processing steps of FIGS. 6A-6D can be performed to form the various p-doped active regions (232A, 234A, 232B, 234B) and the various n-doped active regions (132A, 134A, 334A, 132B, 134B, 334B) and dielectric gate spacers 56. In this case, an n-doped gate electrode portion of the first p-type pull-up transistor M2 (formed in the first active area A1) and an n-doped gate electrode portion of the first n-type pull-down transistor M1 (formed in the second active area A2) are two discrete n-doped gate electrode portions that are not in direct contact with each other. Likewise, an n-doped gate electrode portion of the second p-type pull-up transistor M4 (formed in the third active area A3) and an n-doped gate electrode portion of the second n-type pull-down transistor M3 (formed in the fourth active area A4) are two discrete n-doped gate electrode portions that are not in direct contact with each other.

Referring to FIGS. 10A-10D, subsequent processing steps for forming the first exemplary structure can be performed with appropriate modifications to the pattern of the various contact via structures (72, 74, 75) and the first metal line structures 92. The gate electrode of each p-type pull-up transistor needs to be electrically shorted to the gate electrode of a respective n-type pull-down transistor in this case. Thus, first interconnect via structures 162 embedded in a first via-level dielectric layer 160 and second metal line structures 192 embedded in a second line-level dielectric layer 190 can be employed to provide electrical connection between the gate electrode of each p-type pull-up transistor (M2, M4) and the gate electrode of a respective n-type pull-down transistor (M1, M3) in lieu of a continuous n-doped gate electrode 52.

The various embodiments of the present disclosure can provide a static random access memory (SRAM) cell, which comprises: a first series connection of a first p-type pull-up transistor M2 (formed in a first active area A1) and a first n-type pull-down transistor M1 (formed in a second active area A2) located between a power supply source $V_{DD}$ (that is electrically shorted to the first p-doped source region 232A and the second p-doped source region 232B) and electrical ground (that is electrically shorted to the first n-doped source region 132A and the second n-doped source region 132B), and a second series connection of a second p-type pull-up transistor M4 (formed in a third active area M3) and a second n-type pull-down transistor M3 (formed in a fourth active area A4) located between the power supply source and the electrical ground, wherein at least one of the first p-type pull-up transistor M2 and the second p-type pull-up transistor M4 comprises an n-doped gate electrode portion (which is a portion of an n-doped gate electrode 52). In the first and second exemplary structures, the first p-type pull-up transistor M2 comprises a first-thickness gate dielectric 150 having a first thickness, and the first n-type pull-down transistor M1 comprises a second-thickness gate dielectric 50 having a second thickness that is less than the first thickness.

In one embodiment, each of the first p-type pull-up transistor M2, the first n-type pull-down transistor M1, the second p-type pull-up transistor M4, and the second n-type pull-down transistor M3 comprises a respective n-doped gate electrode portion.

In one embodiment, each n-doped gate electrode portion of the first p-type pull-up transistor M2, the first n-type pull-down transistor M1, the second p-type pull-up transistor M3, and the second n-type pull-down transistor M4 comprises n-doped polysilicon which has a same material composition.

In one embodiment, the SRAM cell further comprises at least one pass gate transistor (M5, M6) including an active region (134A or 134B) that is electrically shorted to an active region (134A or 134B) of one of the first and second series connections, wherein the at least one pass gate transistor (M5, M6) comprises an n-doped gate electrode portion (a portion of an n-doped gate electrode 52). In some embodiments, an active region (134A or 134B) of a pass gate transistor (M5, M6) can be an active region (134A or 134B) of one of the first and second series connections.

In one embodiment, the n-doped gate electrode portion of the at least one pass gate transistor (M5, M6) can have a same material composition as the n-doped gate electrode portions of the first p-type pull-up transistor M2, the first n-type pull-down transistor M1, the second p-type pull-up transistor M4, and the second n-type pull-down transistor M3.

In the first and second exemplary structures, an n-doped gate electrode portion of the first p-type pull-up transistor M2 and an n-doped gate electrode portion of the first n-type pull-down transistor M1 are portions of a first n-doped gate electrode 52A.

In the first and second exemplary structures, an n-doped gate electrode portion of the second p-type pull-up transistor M4 and an n-doped gate electrode portion of the second n-type pull-down transistor M3 are portions of a second n-doped gate electrode 52.

In the first and second exemplary structures, the n-doped gate electrode portion of the first p-type pull-up transistor M2 has a first uniform width; the n-doped gate electrode portion of the first n-type pull-down transistor M1 has a second uniform width that is less than the first uniform width; and the first n-doped gate electrode 52A has a connection region having a tapered width that changes from the first uniform width to the second uniform width.

In conventional SRAM cells, the spacing between n-type metal oxide semiconductor field effect transistors (NMOSFETs) and p-type metal oxide semiconductor field effect transistors (PMOSFETs) is large due to separate formation of n-doped gate electrodes and p-doped gate electrodes. Embodiments of the present disclosure employ an n-doped gate electrode for each of the PMOSFETs in an SRAM cell. Because the design rule triggered by separation of p-doped gate electrodes from n-doped gate electrodes is not applicable in the embodiments of the present disclosure, the distance between the NMOSFETs and PMOSFETs can be significantly reduced, and the SRAM cell of the embodiments of the present disclosure can be significantly smaller than prior art SRAM cells.

Device simulation results for the SRAM cells of the embodiments of the present disclosure indicate that use of PMOSFETs (which are p-type pull-up transistors (M2, M4)) having longer gate lengths than the gate lengths of NMOSFETs provides enhanced write margin for the SRAM cell of embodiments of the present disclosure. Further, the device simulation results for the SRAM cells of the present disclosure indicate that use of a thicker gate dielectric for the PMOSFETs of embodiments of the SRAM cells of the present disclosure further enhances the write margin for the SRAM cells.

In addition, direct electrical connection between a gate electrode of a p-type pull-up transistor (M2, M4) and a gate electrode of an n-type pull-down transistor (M1, M3) at the gate level without use of any contact via structure can reduce electrical wiring. Specifically, the connection regions of the first and second n-doped gate electrodes (52A, 52) function as gate level interconnect structures, and thus, enables reduction of the size of the SRAM cells of embodiments of the of the present disclosure. Interconnection through the connection regions of the first and second n-doped gate electrodes (52A, 52) without formation of p-n junctions is possible because the gate electrodes of the p-type pull-up transistors are n-doped.

Further, issues related to boron diffusion (such as boron penetration through a gate dielectric into channel regions) in gate structures is moot in the SRAM cell of the embodiments of the present disclosure because p-type doping is not employed at the gate level.

The SRAM cell of the embodiments of the present disclosure can be incorporated into any other semiconductor device known in the art. For example, the SRAM cells of embodiments of the present disclosure are incorporated into a three-dimensional memory device such as a three-dimensional NAND memory device, a three-dimensional ReRAM device, a three-dimensional MRAM device, and/or a three-dimensional STT RAM device. Specifically, the SRAM cells can be part of the driver circuit of the NAND memory device.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A static random access memory (SRAM), comprising:
   a first series connection of a first p-type pull-up transistor and a first n-type pull-down transistor located between a power supply source and electrical ground; and
   a second series connection of a second p-type pull-up transistor and a second n-type pull-down transistor located between the power supply source and the electrical ground,
   wherein:
   each of the first p-type pull-up transistor, the first n-type pull-down transistor, the second p-type pull-up transistor, and the second n-type pull-down transistor comprises a respective n-doped gate electrode portion;
   the first p-type pull-up transistor comprises a first-thickness gate dielectric having a first thickness;
   the first n-type pull-down transistor comprises a second-thickness gate dielectric having a second thickness that is less than the first thickness; and
   each n-doped gate electrode portion of the first p-type pull-up transistor, the first n-type pull-down transistor, the second p-type pull-up transistor, and the second n-type pull-down transistor comprises n-doped polysilicon which has a same material composition.

2. The SRAM of claim 1, wherein the SRAM cell further comprises at least one pass gate transistor including an active region that is electrically shorted to an active region of one of the first and second series connections, wherein the at least one pass gate transistor comprises an n-doped gate electrode portion.

3. The SRAM of claim 2, wherein the n-doped gate electrode portion of the at least one pass gate transistor has a same material composition as the n-doped gate electrode portions of the first p-type pull-up transistor, the first n-type pull-down transistor, the second p-type pull-up transistor, and the second n-type pull-down transistor.

4. A static random access memory (SRAM), comprising:
   a first series connection of a first p-type pull-up transistor and a first n-type pull-down transistor located between a power supply source and electrical ground; and
   a second series connection of a second p-type pull-up transistor and a second n-type pull-down transistor located between the power supply source and the electrical ground,
   wherein:
   each of the first p-type pull-up transistor, the first n-type pull-down transistor, the second p-type pull-up transistor, and the second n-type pull-down transistor comprises a respective n-doped gate electrode portion;
   the first p-type pull-up transistor comprises a first-thickness gate dielectric having a first thickness;
   the first n-type pull-down transistor comprises a second-thickness gate dielectric having a second thickness that is less than the first thickness; and
   an n-doped gate electrode portion of the first p-type pull-up transistor and an n-doped gate electrode portion of the first n-type pull-down transistor are portions of a first n-doped gate electrode.

5. The SRAM of claim 4, wherein an n-doped gate electrode portion of the second p-type pull-up transistor and an n-doped gate electrode portion of the second n-type pull-down transistor are portions of a second n-doped gate electrode.

6. The SRAM of claim 4, wherein:
   the n-doped gate electrode portion of the first p-type pull-up transistor has a first uniform width;
   the n-doped gate electrode portion of the first n-type pull-down transistor has a second uniform width that is less than the first uniform width; and
   the first n-doped gate electrode has a connection region having a tapered width that changes from the first uniform width to the second uniform width.

7. The SRAM of claim 6, further comprising a shallow trench isolation structure that laterally surrounds a first active area in which the first p-type pull-up transistor is located and a second active area in which the first n-type pull-down transistor is located, wherein the connection region of the first n-doped gate electrode overlies a portion of the shallow trench isolation structure located between the first active area and the second active area.

8. A static random access memory (SRAM), comprising:
   a first series connection of a first p-type pull-up transistor and a first n-type pull-down transistor located between a power supply source and electrical ground; and
   a second series connection of a second p-type pull-up transistor and a second n-type pull-down transistor located between the power supply source and the electrical ground,
   wherein:
   each of the first p-type pull-up transistor, the first n-type pull-down transistor, the second p-type pull-up transistor, and the second n-type pull-down transistor comprises a respective n-doped gate electrode portion;
   the first p-type pull-up transistor comprises a first-thickness gate dielectric having a first thickness;
   the first n-type pull-down transistor comprises a second-thickness gate dielectric having a second thickness that is less than the first thickness; and
   an n-doped gate electrode portion of the first p-type pull-up transistor and an n-doped gate electrode portion of the first n-type pull-down transistor are two discrete n-doped gate electrode portions that are not in direct contact with each other.

9. A static random access memory (SRAM), comprising:
   a first series connection of a first p-type pull-up transistor and a first n-type pull-down transistor located between a power supply source and electrical ground; and
   a second series connection of a second p-type pull-up transistor and a second n-type pull-down transistor located between the power supply source and the electrical ground,
   wherein:
   each of the first p-type pull-up transistor, the first n-type pull-down transistor, the second p-type pull-up transistor, and the second n-type pull-down transistor comprises a respective n-doped gate electrode portion;

the first p-type pull-up transistor comprises a first-thickness gate dielectric having a first thickness;

the first n-type pull-down transistor comprises a second-thickness gate dielectric having a second thickness that is less than the first thickness;

the second p-type pull-up transistor comprises the first-thickness gate dielectric having a first thickness; and the second n-type pull-down transistor comprises the second-thickness gate dielectric having a second thickness that is less than the first thickness.

10. The SRAM of claim 9, wherein the SRAM is part of a driver circuit for a three-dimensional NAND memory device.

11. A method of forming a static random access memory (SRAM), comprising:

forming a first series connection of a first p-type pull-up transistor and a first n-type pull-down transistor located between a power supply source and electrical ground over a semiconductor substrate, and forming a second series connection of a second p-type pull-up transistor and a second n-type pull-down transistor located between the power supply source and the electrical ground over the semiconductor substrate, wherein:

the first p-type pull-up transistor and the second p-type pull-up transistor comprise n-doped gate electrode portions;

the first and second p-type pull-up transistors are formed on first-thickness gate dielectrics having a first thickness;

the first and second n-type pull-down transistors are formed on second-thickness gate dielectrics having a second thickness that is less than the first thickness; and each of the first p-type pull-up transistor, the first n-type pull-down transistor, the second p-type pull-up transistor, and the second n-type pull-down transistor is provided by forming a respective patterned n-doped gate electrode portion.

12. The method of claim 11, wherein each patterned n-doped gate electrode portion of the first p-type pull-up transistor, the first n-type pull-down transistor, the second p-type pull-up transistor, and the second n-type pull-down transistor is formed by patterning an n-doped semiconductor material layer without any lateral compositional gradient in a same patterning step.

13. The method of claim 12, wherein the SRAM cell further comprises at least one pass gate transistor including an active region that is electrically shorted to an active region of one of the first and second series connections, wherein a patterned n-doped gate electrode portion of the at least one pass gate transistor is formed by patterning the n-doped semiconductor material layer.

14. The method of claim 11, wherein an n-doped gate electrode portion of the first p-type pull-up transistor and an n-doped gate electrode portion of the first n-type pull-down transistor are formed as portions of a first n-doped gate electrode.

15. The method of claim 14, wherein an n-doped gate electrode portion of the second p-type pull-up transistor and an n-doped gate electrode portion of the second n-type pull-down transistor are portions of a second n-doped gate electrode.

16. The method of claim 15, wherein:

the n-doped gate electrode portion of the first p-type pull-up transistor has a first uniform width;

the n-doped gate electrode portion of the first n-type pull-down transistor has a second uniform width that is less than the first uniform width; and the first n-doped gate electrode has a connection region having a tapered width that changes from the first uniform width to the second uniform width.

17. The method of claim 11, further comprising:

forming a first-thickness gate dielectric layer on a top surface of the semiconductor substrate;

patterning the first-thickness gate dielectric layer to form the first-thickness gate dielectrics;

forming a second-thickness gate dielectric layer on the top surface of the semiconductor substrate after formation of the first-thickness gate dielectrics; and patterning the second-thickness gate dielectric layer to form the second-thickness gate dielectrics.

* * * * *